(12) United States Patent
Kudou et al.

(10) Patent No.: US 6,303,948 B1
(45) Date of Patent: *Oct. 16, 2001

(54) PAD LAYOUT AND LEAD LAYOUT IN SEMICONDUCTOR DEVICE

(75) Inventors: Manami Kudou, Tokyo; Masaru Koyanagi, Yokohama, both of (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/805,604

(22) Filed: Feb. 26, 1997

(30) Foreign Application Priority Data

Feb. 29, 1996 (JP) ....................................................... 8-043466

(51) Int. Cl.⁷ ........................... H01L 27/10; H01L 23/12; H01L 23/52; H01L 29/40
(52) U.S. Cl. ........................... 257/207; 257/773; 257/786; 438/612
(58) Field of Search .................................... 257/207, 773, 257/786; 438/612

(56) References Cited

U.S. PATENT DOCUMENTS

| | | | |
|---|---|---|---|
| 5,072,280 | 12/1991 | Matsukura | 357/70 |
| 5,646,548 * | 7/1997 | Yao et al. | 326/80 |
| 5,719,449 * | 2/1998 | Strauss | 257/786 |
| 5,801,451 * | 9/1998 | Yamauchi | 257/786 |
| 5,854,508 * | 12/1998 | Kajigaya et al. | 257/786 |

FOREIGN PATENT DOCUMENTS

| | | | |
|---|---|---|---|
| 3-214669 | 9/1991 | (JP) . | |
| 06021260 A | 1/1994 | (JP) . | |
| 6-053413 * | 2/1994 | (JP) | 257/786 |
| 6-252329 | 9/1994 | (JP) . | |
| 6-275771 | 9/1994 | (JP) . | |
| 6-349875 | 12/1994 | (JP) . | |
| 07078926 A | 3/1995 | (JP) . | |
| 83105742 | 8/1994 | (TW) . | |

OTHER PUBLICATIONS

T. Isono, PTO–89–4074 tranlation of Japanese Kokai Patent Application No. 6–053413, Feb. 1994.*

* cited by examiner

Primary Examiner—Olik Chaudhuri
Assistant Examiner—Howard Weiss
(74) Attorney, Agent, or Firm—Banner & Witcoff, Ltd.

(57) ABSTRACT

A semiconductor device includes a semiconductor chip and a circuit formed in the semiconductor chip. Pads are arranged in a plurality of rows on the semiconductor chip and electrically connected to the circuit. The pads on adjacent rows are offset from each other. Leads are provided on the semiconductor chip and bonding wires selectively connect the leads to the pads.

36 Claims, 10 Drawing Sheets

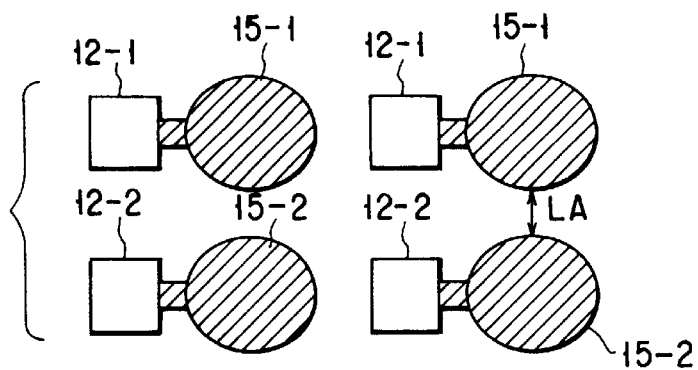
(PRIOR ART) FIG. 6
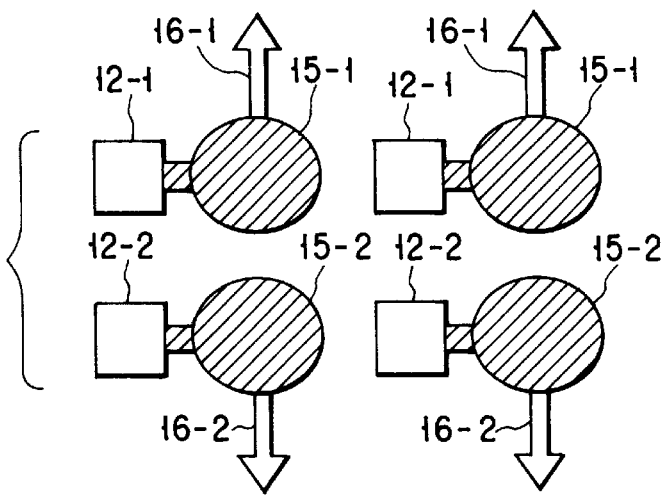
(PRIOR ART) FIG. 7
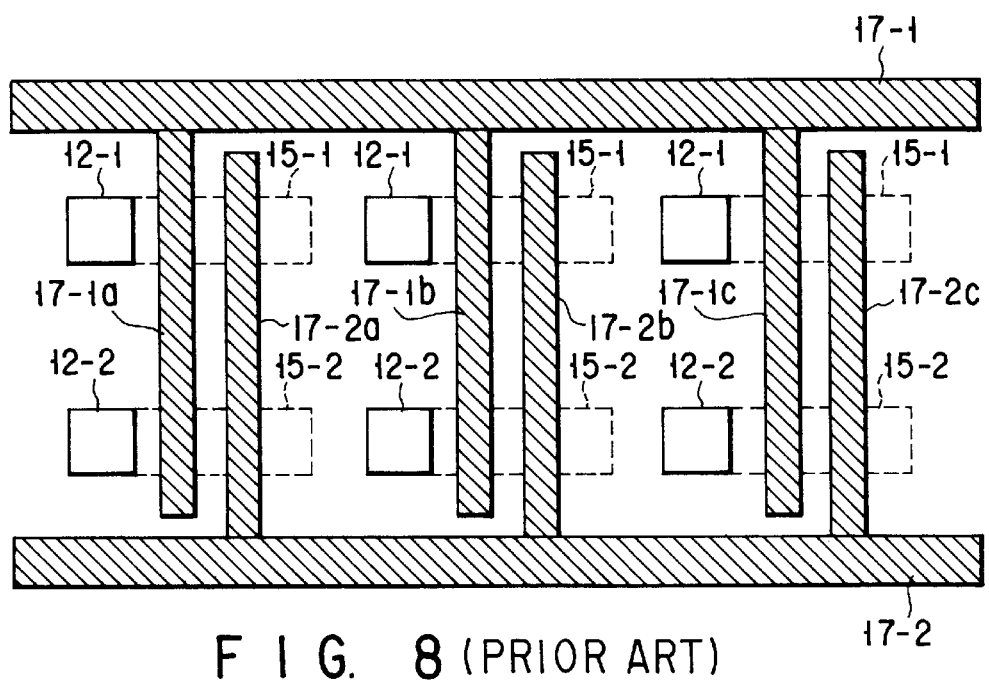
FIG. 8 (PRIOR ART)

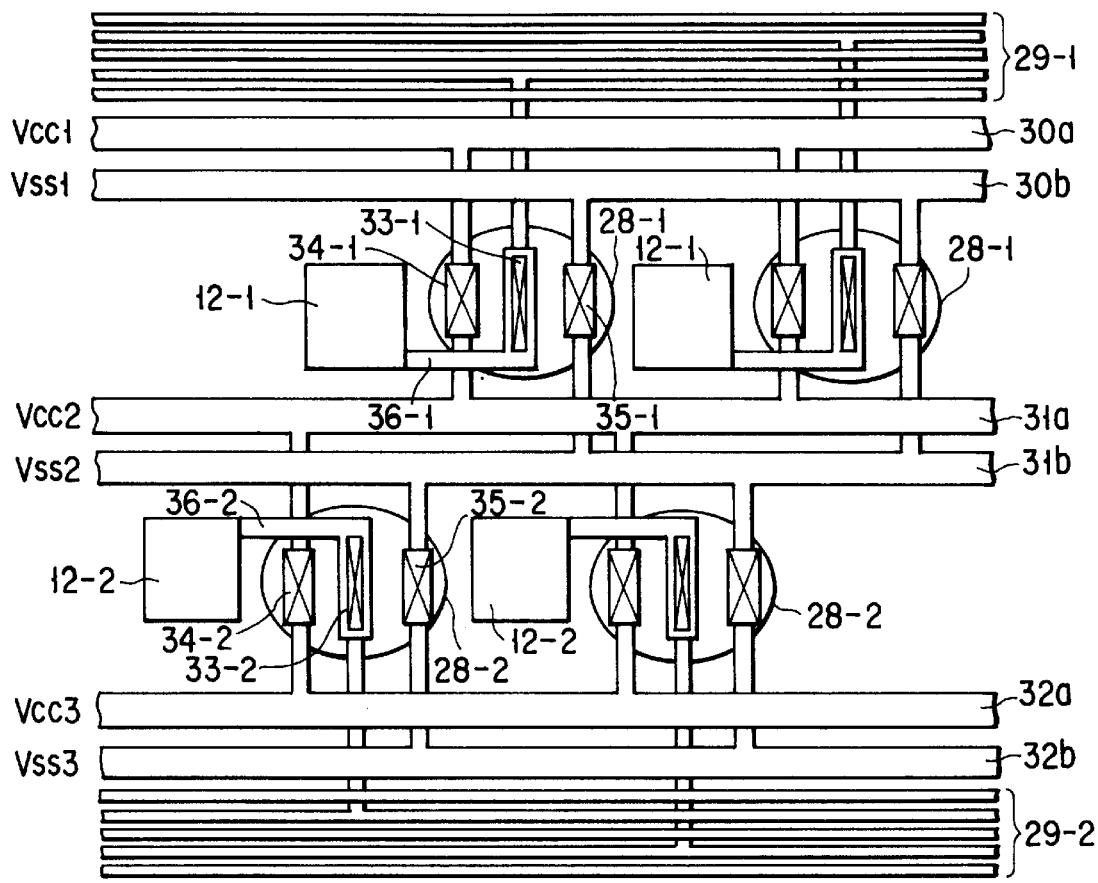
F I G. 16
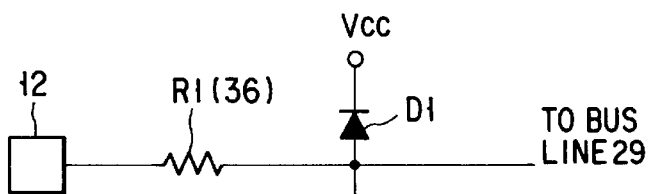
F I G. 17A
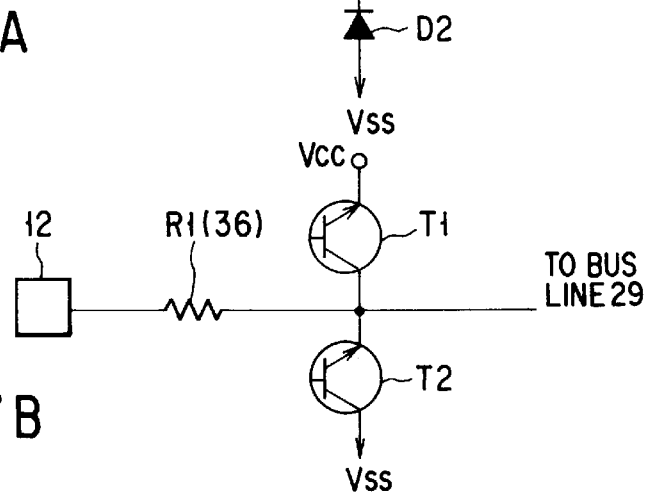
F I G. 17B

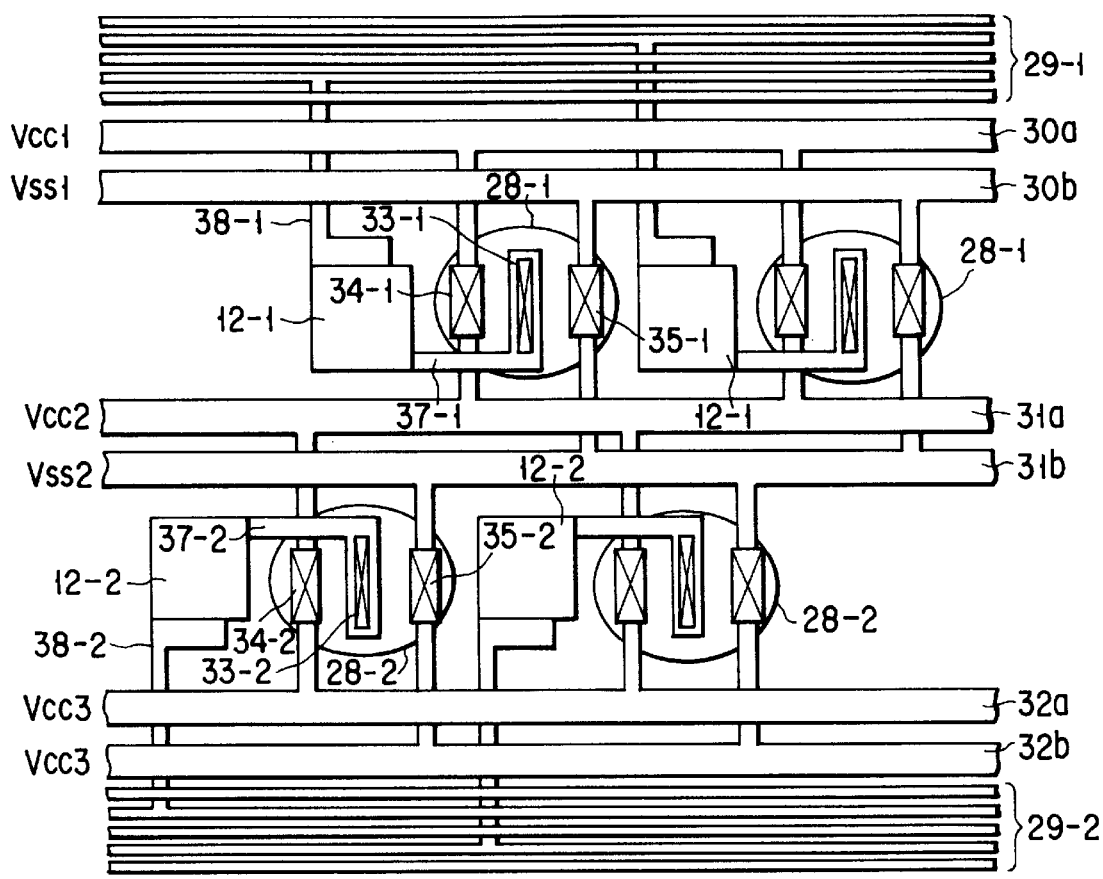
FIG. 18
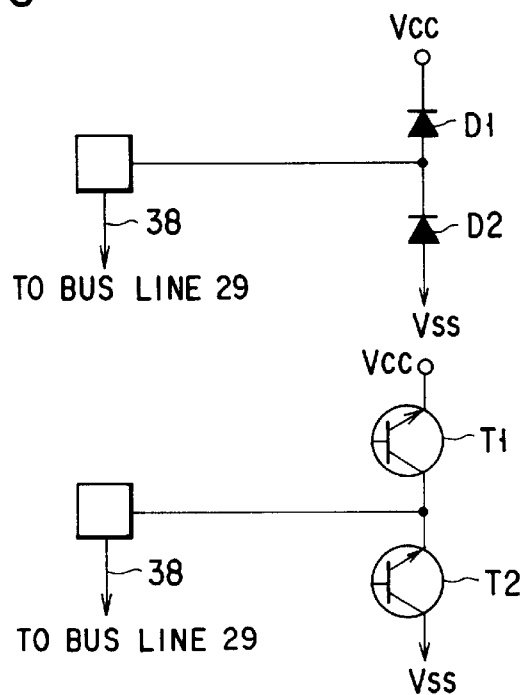
FIG. 19A
FIG. 19B

PAD LAYOUT AND LEAD LAYOUT IN SEMICONDUCTOR DEVICE

BACKGROUND OF THE INVENTION

The present invention generally relates to a semiconductor device and, more particularly, to a layout for pads and leads for a semiconductor device.

Generally, in a semiconductor device, pads for leading out electrodes from an internal circuit are arranged in a row along the periphery of the chip or in the central portion thereof. FIGS. 1 to 3 show various examples of conventional pad layouts and lead layouts in which respective pads of the semiconductor chip are connected with the leads by wire bonding (in a state prior to the packaging). FIG. 1 shows the layout which is most widely used and in which pads 12 are arranged along the four sides of the semiconductor chip 11. The chip 11 is mounted on a bed B and the end portions of the leads 13 and the pads 12 are respectively connected via bonding wires 14. FIG. 2 shows the LOC (Lead On Chip) structure in which pads 12 are arranged along two opposite sides of a chip 11 and the end portions of leads 13 which are provided on the chip 11 are connected to the respective pads 12 via bonding wires 14. FIG. 3 shows the LOC structure of center pad type in which pads 12 are arranged in a row in the central portion of a chip 11 and the end portions of leads 13 which are provided on the chip 11 are connected to the respective pads 12 via bonding wires 14.

The various types of pad layouts and lead layouts shown in FIGS. 1 to 3 are described in Mitake et al., "Multi-byte 16 Mbit DRAM", NEC Technical Report, Vol. 46, No. 2/1993, pages 94–97; U.S. Pat. No. 5,072,280 to Matsukura entitled "Resin Sealed Semiconductor Device"; and the article "Starting of Full-Scale Study of LOC for Second Generation 16 Mbit DRAM", November 1991 issue of NIKKEI MICRODEVICES by NIKKEI BP Co., pages 79–83. Each of these documents is incorporated herein by reference.

Recently, with the development of LOC technology, even a small chip which is not required to use LOC is formed in an LOC configuration so as to permit LOC to be utilized. As a result, the pad area is made small. Further, due to diversification of applications, the number of pads has increased, thereby making it very difficult to attain a sufficiently large pad area on the chip. In a package in which pitches between the lead pins are small, it is necessary to make the pitches between the pads smaller, and the requirements for the pad layout and lead layout become increasingly severe.

In order to solve the above problems, a pad layout in which pads are arranged on plural rows as shown in FIGS. 4 and 5 has been proposed. In FIG. 4, pads 12-1, 12-2 are arranged in two rows in the central portion of a chip 11, and in FIG. 5, pads 12-1, 12-2, 12-3 are arranged in three rows in the central portion of a chip 11. By using the above pad layouts, it becomes easier to attain a sufficiently large pad area on the chip 11 and to reduce the length of the pad rows even if the number of pads increases. Thus, it becomes possible to cope with a reduction in chip size, an increase in the number of pads, and a reduction in pitch.

However, when the pads are arranged on plural rows, the following problems (a) to (f) occur. (a) Restrictions occur when the pads and the end portions of the leads are connected by wire bonding. (b) It is difficult to attain a sufficiently large distance between patterns of protection circuits provided for the pads. (c) A restriction is imposed on extensions of the wirings from the pads to the internal circuit. (d) It becomes difficult to arrange the power supply lines of the protection circuit. (e) It is necessary to apply probes to both sides of the chip when probes are applied to the chip in the wafer state and it is difficult to simultaneously test a plurality of chips. (f) Since bonding wires are formed at least on both sides of the chip, it becomes difficult to apply probes after wire bonding and it becomes difficult to measure the amplitudes of signals on signal lines and observe the signal waveforms at the time of development of new products.

That is, for example, in the pad layout shown in FIG. 4, since it is difficult to effect wire bonding if the leads are not formed to extend from the upper side and from the lower side of the chip 11, it is difficult to apply the layout to a package such as SVP (Surface Vertical Package) and ZIP (Zigzag In-line Package) in which the leads are formed to extend from one side of the chip 11. In addition, when pads are arranged in more than row, the number of chips which can be simultaneously tested decreases. For example, in the case in which pads are arranged in a single row, one chip (or the chips in a first row) can be tested by moving a first probe into contact with the wafer from a first direction and another chip (or the chips in a second row) can be tested by moving a second probe into contact with the wafer from a second direction opposite to the first direction. However, in the case in which pads are arranged in two rows, these two probes are needed for testing one chip (or the chips in one row). Thus, in the case in which pads are arranged in two rows, only half as many chips can be simultaneously tested as compared to the case in which pads are arranged in a single row. Further, when the bonding wires and leads are formed on both sides of the chip, it becomes difficult after a wire bonding step to move the probes in the first and second directions into contact with pads arranged in two rows. When an internal signal in the chip is measured, test signals or power is supplied to the chip via the leads formed on the side of the chip. In order to test the chip, the probes are moved into contact with the pads by being pushed through the leads which supply the test signals or power to the chip. It is therefore difficult to test the operating characteristics of the chip. Still further, as shown in FIG. 6, protection circuits 15-1, 15-2 for protecting the internal circuits from surge voltages are disposed in position adjacent to the pads 12-1, 12-2. It is necessary to form the protection circuits 15-1, 15-2 in a deep diffusion layer such as a well region and it is necessary to attain a sufficiently long minimum distance LA between the patterns of the protection circuits 15-1 and 15-2 formed adjacent to each other by taking the lateral diffusion of the diffusion layer into consideration. For this reason, the pad layout is limited by the patterns of the protection circuits 15-1, 15-2, thereby making it difficult to reduce the pitches between the pads 12-1, 12-2. When wirings are lead out from the protection circuits 15-1, 15-2 to the internal circuit, the readout directions of the wirings 16-1, 16-2 are restricted as shown in FIG. 7 and thus extension of the wirings to the internal circuit is restricted. Further, power supply lines are required for the protection circuits 15-1, 15-2. As shown in FIG. 8, for example, it is necessary to dispose main power supply lines 17-1, 17-2 on both sides of the pads 12-1, 12-2 in the two rows and dispose branch power supply lines 17-1a, 17-1b, 17-1c and 17-2a, 17-2b, 17-2c which are divided from the main power supply lines 17-1, 17-2 in a branch for the respective protection circuits 15-1, 15-2. As a result, the pattern layout of the power supply lines of the protection circuits 15-1, 15-2 becomes complicated and the pattern occupancy area becomes large.

The various problems described above become more serious if the number of rows of pads is set to three as shown in FIG. 5 and become even more serious as the number of rows of pads becomes greater than three.

As described above, the pad layout and lead layout of conventional semiconductor devices make it extremely difficult to effectively cope with a reduction in chip size, an increase in the number of pins of a package, and a reduction in the pitch of the pads.

Further, if the pads are disposed on plural rows in order to cope with a reduction in chip size, an increase in the number of pins of a package, and a reduction in the pitch of the pads, other problems occur with respect to wire bonding, connection to the protection circuits, extension of the wirings, and tests.

BRIEF SUMMARY OF THE INVENTION

In accordance with one aspect of the invention, a semiconductor device includes a semiconductor chip and a circuit formed in the semiconductor chip. First and second pad groups each include spaced apart pads arranged on the semiconductor chip and electrically connected to the circuit. The pads of the second pad group are offset from the pads of the first pad group by one-half of the pitch of the pads of the first pad group. First and second lead groups are provided. Each lead of the first lead group has a lead portion with a center line which is substantially aligned with the center of a corresponding pad of the second pad group and each lead of the second lead group has a lead portion with a center line which is substantially aligned with the center of a corresponding pad of the first pad group. Bonding wires selectively connect the lead portions of the leads of the first and second lead groups to the pads of the first and second pad groups.

With the above arrangement, since the pad groups are separately arranged on two rows, it becomes easier to cope with reductions in chip size, increases in the number of pins of a package, and reductions in the pitch of the pads. Since the pads on one row are offset from the pads on the other row by ½ pitch, it is possible to selectively connect any one of a plurality of adjacent pads to a lead in a lead group by wire bonding at the time of wire bonding. Therefore, the degree of freedom of wire bonding and connection with the circuit in the semiconductor chip can be enhanced. Further, when a probe is applied to the chip in the wafer state, the probe can be applied to one side of the chip, thereby making it possible to simultaneously test a plurality of chips.

In accordance with another aspect of the present invention, a semiconductor device includes a semiconductor chip and a circuit formed in the semiconductor chip. First and second pad groups each include spaced apart pads arranged on the semiconductor chip and electrically connected to the circuit. The pads of the second pad group are offset from the pads of the first pad group by one-half of the pitch of the pads of the first pad group. A lead group is provided. Each lead of the lead group has a lead portion provided in correspondence with one of the pads of the first and second pad groups. Bonding wires selectively connect the lead portions of the leads of the lead group to the pads of the first and second pad groups.

With the above arrangement, since the pad groups are separately arranged on two rows, it becomes easier to cope with reductions in the chip size, increases in the number of pins of a package, and reductions in the pitch of the pads. Since the pads on one row are offset from the pads on the other row, it is possible to selectively connect a plurality of pads to the leads of a lead group formed to extend from one side of the semiconductor chip onto the chip by wire bonding.

Therefore, the chip can be sealed into an SVP or ZIP even if a two-row pad layout is used. Further, when a probe is applied to the chip in the wafer state, the probe can be applied to one side of the chip, thereby making it possible to simultaneously test a plurality of chips. In addition, after wire bonding, the probe can be easily applied to the chip and internal signals can be easily measured.

In accordance with a further aspect of the present invention, a semiconductor device includes a semiconductor chip and a circuit formed in the semiconductor chip. First, second, and third pad groups each include spaced apart pads arranged on the semiconductor chip and electrically connected to the circuit. The pads of the second pad group are offset from the pads of the first pad group by one-half of the pitch of the pads of the first pad group, and the pads of the third pad group are offset from the pads of the second pad group by one-half of the pitch of the pads of the second pad group. First and second lead groups are provided. Each lead of the first lead group has a lead portion which extends in a direction which is perpendicular to the direction in which the pads of the first, second, and third pad groups are spaced apart. Each lead of the second lead group has a lead portion extending toward the lead portions of the leads of the first lead group. Bonding wires selectively connect the lead portions of the leads of the first and second lead groups to the pads of the first, second and third pad groups.

With the above arrangement, since the pad groups are separately arranged on three rows, it becomes easier to cope with reductions in chip size, increases in the number of pins of a package, and reductions in the pitch of the pads. Since the pads on the three rows are shifted from one another by ½ pitch, it is possible to selectively connect any one of a plurality of adjacent pads to a lead in a lead group by wire bonding at the time of wire bonding. Therefore, the degree of freedom of wire bonding and connection with the circuit in the semiconductor chip can be enhanced.

In accordance with yet another aspect of the present invention, a semiconductor device includes a semiconductor chip and a circuit formed in the semiconductor chip. First, second, and third pad groups each include spaced apart pads arranged on the semiconductor chip and electrically connected to the circuit. The pads of the second pad group are offset from the pads of the first pad group by one-third of the pitch of the pads of the first pad group. The pads of the third pad group are offset from the pads of the second pad group by one-third of the pitch of the pads of the second pad group and are offset from the pads of the first pad group by two-thirds of the pitch of the pads of the first pad group. First and second lead groups are provided. Each lead of the first lead group has a lead portion which extends in a direction which is substantially perpendicular to the direction in which the pads of the first, second, and third pad groups are spaced apart, the lead portions of the leads of the first lead group being disposed at a pitch which is equal to two-thirds of the pitch of the pads of the first and second pad groups. Each lead of the second lead group has a lead portion extending toward the lead portions of the leads of the first lead group, the lead portions of the leads of the second lead group being disposed at a pitch which is equal to two-thirds of the pitch of the pads of the first and second pad groups and being arranged in positions offset from the respective lead portions of the leads of the first lead group by ⅓ pitch. Bonding wires selectively connect the lead portions of the leads of the first and second lead groups to the pads of the first, second and third pad groups.

With the above arrangement, since the pad groups are separately arranged on three rows, it becomes easier to cope with reductions in chip size, increases in the number of pins of a package, and reductions in the pitch of the pads. Since the pads on the three rows are shifted from one another by ⅓ pitch, it is possible to selectively connect any one of a plurality of adjacent pads to a lead in one of the lead groups by wire bonding at the time of wire bonding. Therefore, the degree of freedom of wire bonding and connection with the circuit in the semiconductor chip can be enhanced. Further, when a probe is applied to the chip in the wafer state, the probe can be applied to one side of the chip, thereby making it possible to simultaneously test a plurality of chips.

In accordance with still another aspect of the present invention, a semiconductor device includes a semiconductor chip and a circuit formed in the semiconductor chip. First, second, and third pad groups each include spaced apart pads arranged on the semiconductor chip and electrically connected to the circuit. The pads of the second pad group are offset from the pads of the first pad group by one-third of the pitch of the pads of the first pad group. The pads of the third pad group are offset from the pads of the second pad group by one-third of the pitch of the pads of the second pad group and are offset from the pads of the first pad group by two-thirds of the pitch of the pads of the first pad group. A lead group is provided. Each lead has a lead portion which extends in a direction which is substantially perpendicular to the direction in which the pads of the first, second, and third pad groups are spaced apart. Bonding wires selectively connect the lead portions of the leads of the lead group to the pads of the first, second and third pad groups.

With the above arrangement, since the pad groups are separately arranged on three rows, it becomes easier to cope with reductions in chip size, increases in the number of pins of a package, and reductions in the pitch of the pads. Since the pads on the three rows are offset from one another by ⅓ pitch, it is possible to selectively connect leads in a lead group extending from one side of the semiconductor chip onto the chip by wire bonding. Therefore, the chip can be sealed into an SVP or ZIP even if the three-row pad layout is used. Further, when a probe is applied to the chip in the wafer state, the probe can be applied to one side of the chip, thereby making it possible to simultaneously test a plurality of chips. In addition, after wire bonding, the probe can be easily applied to the chip and internal signals can be easily measured.

In accordance with still another aspect of the present invention, a semiconductor device includes a semiconductor chip and a circuit formed in the semiconductor chip. Pads are arranged in a plurality of rows on the semiconductor chip and electrically connected to the circuit. The pads on adjacent rows are offset from each other. Leads are provided on the semiconductor chip and bonding wires selectively connect the leads to the pads.

With the above arrangement, since the pad groups are separately arranged on plural rows, it becomes easier to cope with reductions in chip size, increases in the number of pins of a package, and reductions in the pitch of the pads. Further, the leads can be disposed on one, two, three or four sides of the chip and the degree of freedom of the lead layout is high.

In accordance with yet another aspect of the present invention, a semiconductor device includes a semiconductor chip and a circuit formed in the semiconductor chip. Pads are electrically connected to the circuit and arranged in a plurality of rows on the semiconductor chip. Leads are provided on the semiconductor chip from at least one side thereof and are connected to respective pads via bonding wires. The leads includes first and second leads, at least one of which is bent on the semiconductor chip to cause a lead portion thereof to surround a plurality of the pads. Bonding wires selectively connect the pads to the leads.

With the above arrangement, since the pads are separately arranged on plural rows, it becomes easier to cope with reductions in chip size, increases in the number of pins of a package, and reductions in the pitch of the pads. Since at least one lead is bent, it is possible to cope with a pad layout which is restricted by a circuit on the lead side.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is a plan view showing an example of the pattern layout of protection circuits in the pad layout shown in FIG. 4;

FIG. 7 is a plan view showing an example of the pattern layout of the protection circuits in the pad layout shown in FIG. 4 and an example of the lead-out of wirings from the protection circuits to the internal circuit;

FIG. 8 is a plan view showing an example of the pattern layout of the protection circuits in the pad layout shown in FIG. 4 and an example of the layout of power supply lines of the protection circuits;

FIG. 16 is a plan view showing other examples of the pattern layouts of the protection circuits and power supply lines, for illustrating a semiconductor device according to a fifth embodiment of this invention;

FIGS. 17A and 17B are circuit diagrams respectively showing examples of the construction of the protection circuits shown in FIG. 16 in detail;

FIG. 18 is a plan view specifically showing still other examples of the pattern layouts of the protection circuits and power supply lines, for illustrating a semiconductor device according to a sixth embodiment of this invention;

FIGS. 19A and 19B are circuit diagrams respectively showing examples of the construction of the protection circuits shown in FIG. 18 in detail;

DETAILED DESCRIPTION OF THE INVENTION

Figure 9:
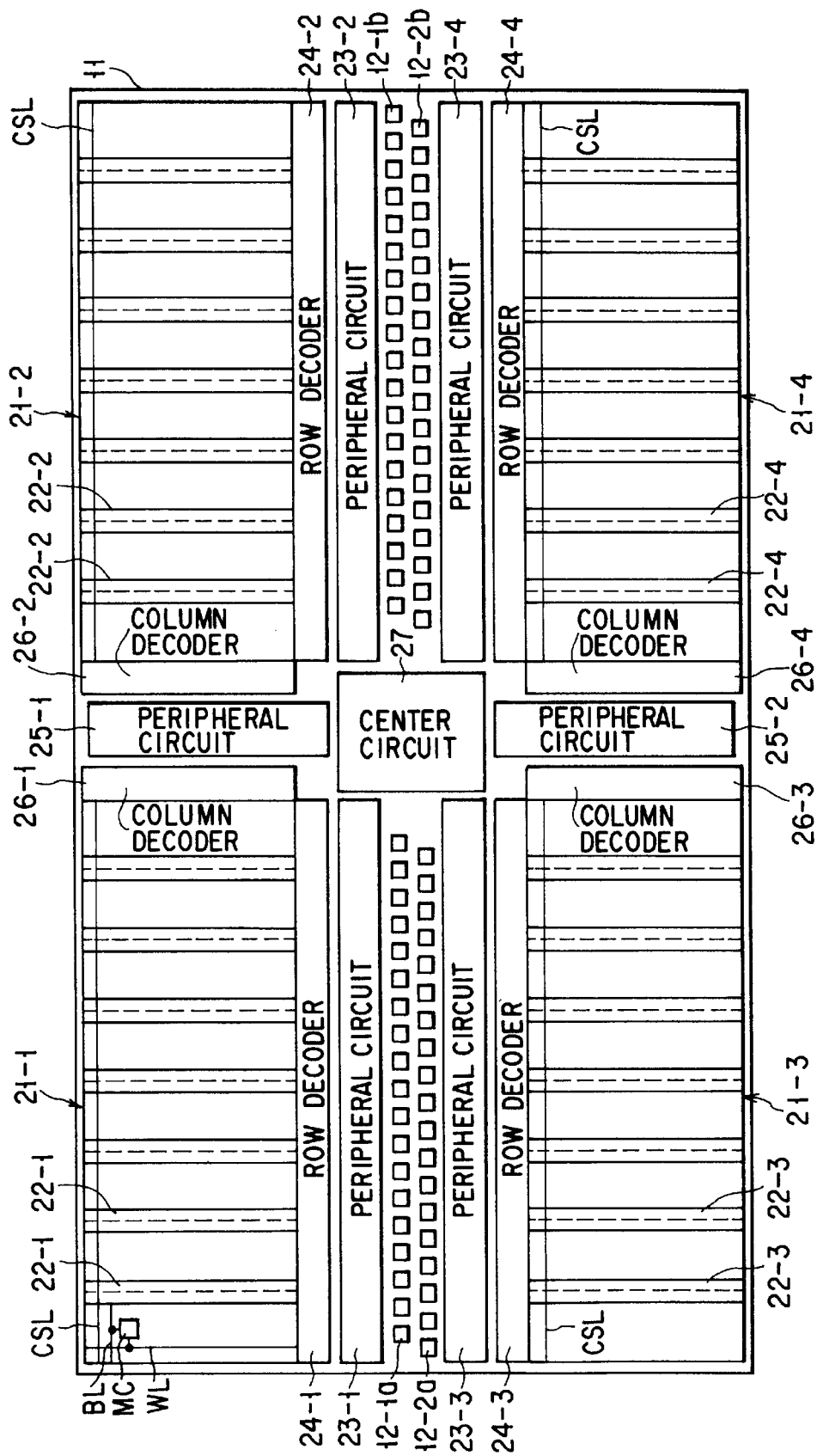
FIG. 9 is a block diagram showing the schematic circuit layout of a 16 Mbit semiconductor memory device, for illustrating a semiconductor device according to a first embodiment of this invention.

FIG. 9 is a block diagram showing the schematic construction of a 16 Mbit semiconductor memory device, for illustrating a semiconductor device according to a first embodiment of this invention. The semiconductor memory device includes 4-Mbit memory cell arrays 21-1 to 21-4. Each of the memory cell arrays 21-1 to 21-4 is constructed by eight sub-arrays of 512 kbits and sense amplifiers 22-1, 22-2, 22-3, 22-4 are arranged between the sub-arrays. Each of the sense amplifiers 22-1, 22-2, 22-3, 22-4 is commonly used by the adjacent sub-arrays. In each of the sub-arrays, word lines WL, bit lines BL, and memory cells MC connected to the word lines WL and bit lines BL are formed. Common column selection lines CSL are formed to extend over the sub-arrays in the respective memory cell arrays 21-1 to 21-4 and each of them is commonly used by the subarrays in a corresponding one of the arrays.

In an area between the memory cell arrays 21-1 and 21-3, two rows of pad groups 12-1a and 12-2a are disposed. Likewise, in an area between the memory cell arrays 21-2 and 21-4, two rows of pad groups 12-1b and 12-2b are disposed. The pads of the pad group 12-1a are shifted or offset from the corresponding pads of the pad group 12-2a by ½ pitch, and the pads of the pad group 12-1b are shifted from the corresponding pads of the pad group 12-2b by ½ pitch. Pitch refers to the distance between the centers of adjacent pads. In an area between the memory cell array 21-1 and the pad groups 12-1a, 12-2a, a peripheral circuit 23-1 is disposed. The peripheral circuit 23-1 contains bus lines and output buffers. In an area between the memory cell array 21-2 and the pad groups 12-1b, 12-2b, a peripheral circuit 23-2 is disposed. The peripheral circuit 23-2 contains bus lines. Further, in an area between the memory cell array 21-3 and the pad groups 12-1a, 12-2a, a peripheral circuit 23-3 is disposed. The peripheral circuit 23-3 contains bus lines and output buffers. In an area between the memory cell array 21-4 and the pad groups 12-1b, 12-2b, a peripheral circuit 23-4 is disposed. The peripheral circuit 23-4 contains bus lines.

In an area between the peripheral circuit 23-1 and the memory cell array 21-1, a row decoder 24-1 for selecting the word lines WL of memory cell array 21-1 is disposed, and in an area between the peripheral circuit 23-2 and the memory cell array 21-2, a row decoder 24-2 for selecting the word lines of memory cell array 21-2 is disposed. In an area between the peripheral circuit 23-3 and the memory cell array 21-3, a row decoder 24-3 for selecting the word lines of memory cell array 21-3 is disposed, and in an area between the peripheral circuit 23-4 and the memory cell array 21-4, a row decoder 24-4 for selecting the word lines of memory cell array 21-4 is disposed.

In an area between the memory cell arrays 21-1 and 21-2, a peripheral circuit 25-1 is disposed and in an area between the memory cell arrays 21-3 and 21-4, a peripheral circuit 25-2 is disposed. The peripheral circuits 25-1, 25-2 contain bus lines. In an area between the peripheral circuit 25-1 and the memory cell array 21-1, a column decoder 26-1 for selecting the common column selection lines CSL of memory cell array 21-1 is disposed, and in an area between the peripheral circuit 25-1 and the memory cell array 21-2, a column decoder 26-2 for selecting the common column selection lines CSL of memory cell array 21-2 is disposed. In an area between the peripheral circuit 25-2 and the memory cell array 21-3, a column decoder 26-3 for selecting the common column selection lines CSL of memory cell array 21-3 is disposed, and in an area between the peripheral circuit 25-3 and the memory cell array 21-4, a column decoder 26-4 for selecting the common column selection lines CSL of memory cell array 21-4 is disposed. Further, a center circuit 27 is disposed in the central portion of the semiconductor chip 11. The center circuit 27 contains a decoder for determining from which one of the pads of pad groups 12-1a and 12-2a the data read out from a selected one or a plurality of memory cell arrays is output. The memory cell arrays 21-1 to 21-4 may be selected in the following ways: each of the memory cell arrays 21-1 to 21-4 is selected one by one; all the memory cell arrays 21-1 to 21-4 are selected simultaneously; the memory cell arrays 21-1 and 21-3 are simultaneously selected; the memory cell arrays 21-2 and 21-4 are simultaneously selected; the memory cell arrays 21-1 and 21-4 are simultaneously selected; and the memory cell arrays 21-2 and 21-3 are simultaneously selected.

Figure 10:
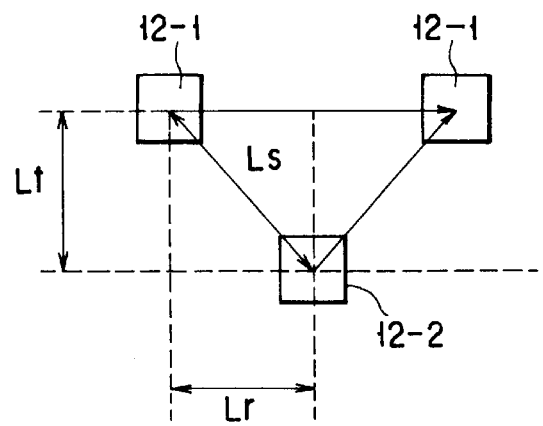
FIG. 10 is an enlarged view showing a pad portion extracted from the circuit layout of FIG. 9.

FIG. 10 is an enlarged view showing a pad portion extracted from the plan view of FIG. 9. As shown in FIG. 10, by arranging the pads 12-1 (12-1a, 12-1b) on the first row in positions offset or shifted from the corresponding pads 12-2 (12-2a, 12-2b) on the second row by ½ pitch, the distance Ls between the adjacent pads on the different rows becomes larger than the distance Lt between the row of the pad group 12-1 and the row of the pad group 12-2. As a result, if the pad area is the same as the layout of FIG. 4, the margin of error of the bonding position at the time of wire bonding can be increased and the manufacturing yield can thereby be enhanced by a reduction in defective bondings. On the other hand, if wire bonding can be effected with a large margin of error, the distance between the pads can be reduced by reducing the distance Ls to the distance Lt (assuming that Lt is the shortest distance) and the occupancy area of the pad area can be reduced. This provides for an increase in the number of pins of the package and a reduction in the pitch of the lead pins. At this time, if Ls is set such that "Ls=2×Lr" and the distance between the pads 12-1 and 12-2 is set to a constant value, the length of the pad row can be minimized without making the wire bonding process difficult.

Figure 11:
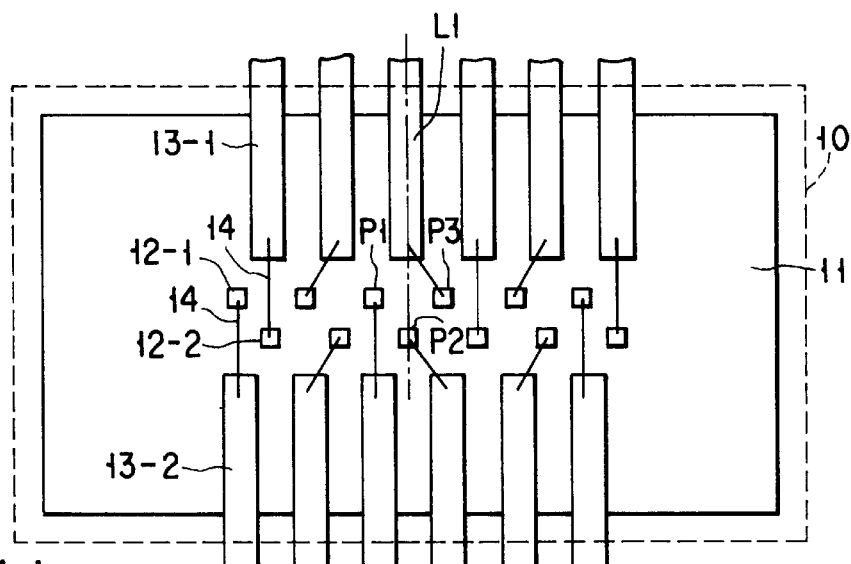
FIG. 11 is a plan view showing an example in which connections are made for a semiconductor memory device having the pad layout shown in FIG. 9 by wire bonding with LOC.

FIG. 11 schematically shows a state in which connections are made for a semiconductor memory device having the pad layout shown in FIG. 9 by wire bonding with LOC. The center lines of upper side leads 13-1 are set to substantially coincide with the centers of the respective pads of the second-row pad group 12-2, and the center lines of lower side leads 13-2 are set to substantially coincide with the centers of the respective pads of the first-row pad group 12-1. With this construction, the pitch of the leads 13-1 is made equal to the pitch of the pads 12-2 and the pitch of the leads 13-2 is made equal to the pitch of the pads 12-1. The semiconductor chip 11, the inner lead portions of the leads 13-1 and 13-2 and the bonding wires 14 are sealed into a resin or ceramic package 10.

Figure 1:
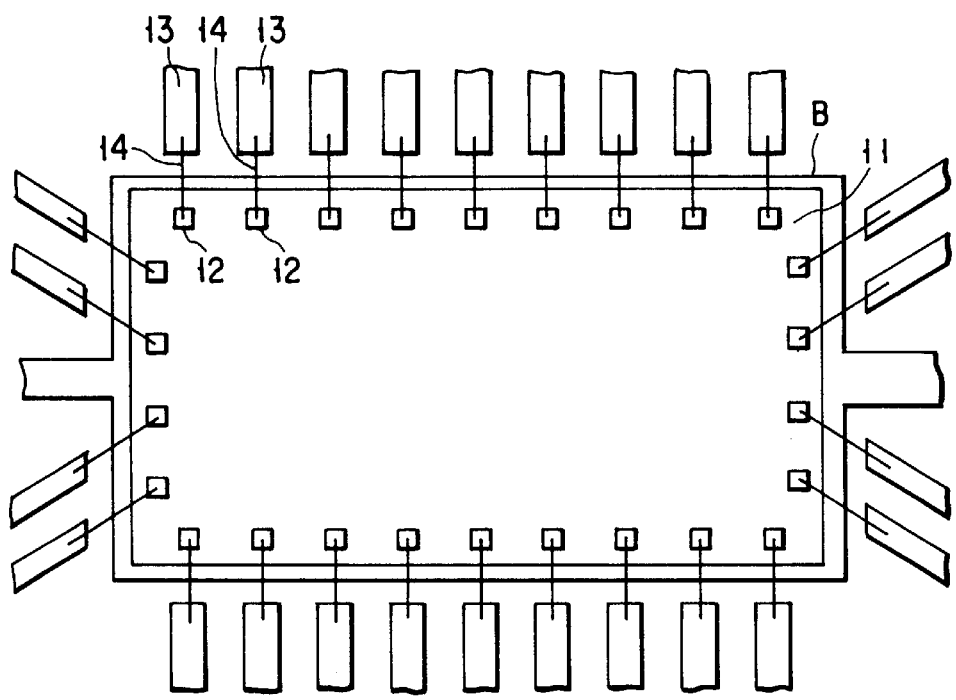
FIG. 1 is a plan view for illustrating a conventional semiconductor device in which pads and leads of the semiconductor chip are connected by wire bonding.
Figure 2:
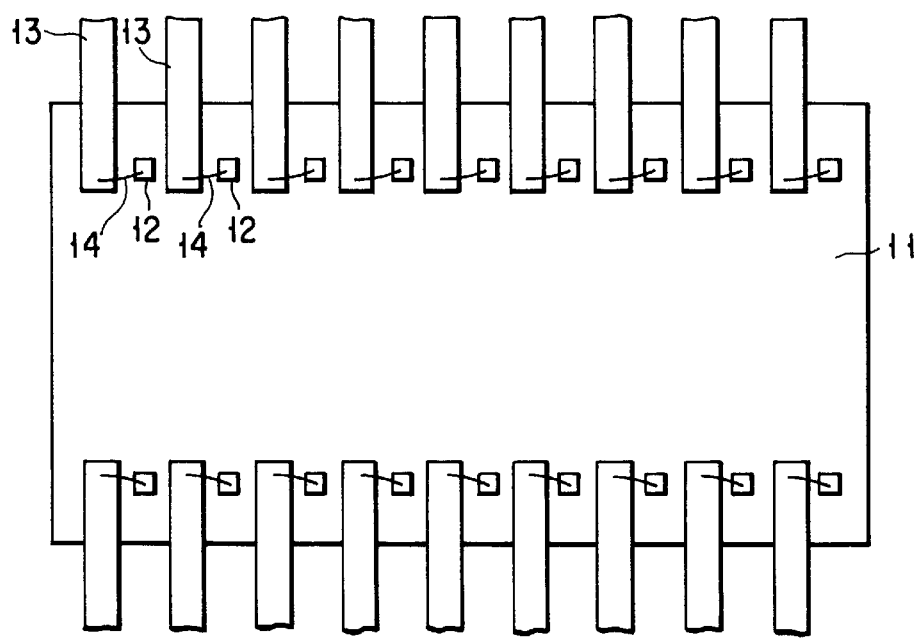
FIG. 2 is a plan view for illustrating another conventional semiconductor device in which pads and leads of the semiconductor chip are connected by wire bonding.
Figure 3:
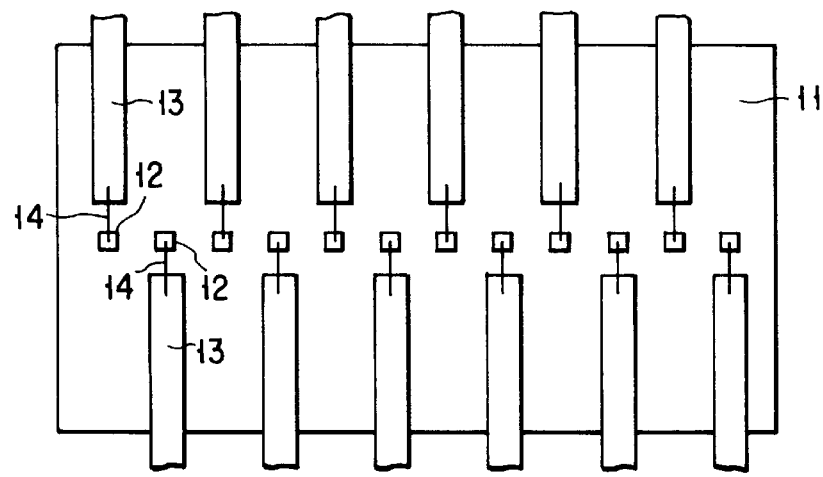
FIG. 3 is a plan view for illustrating still another conventional semiconductor device in which pads and leads of the semiconductor chip are connected by wire bonding.
Figure 4:
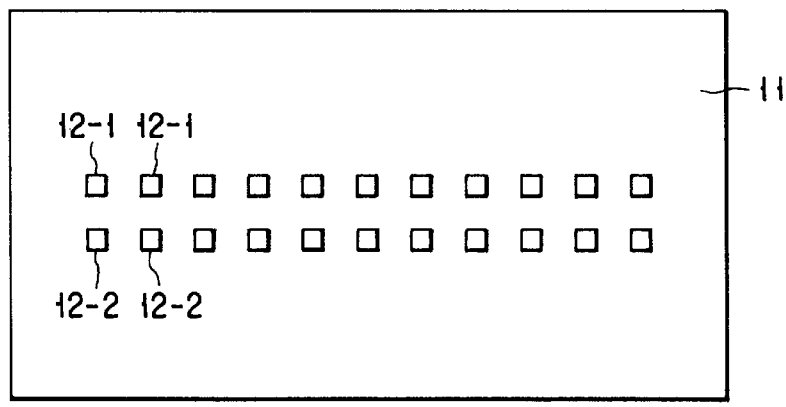
FIG. 4 is a plan view for illustrating a conventional improved semiconductor device and showing the pad layout of the semiconductor chip.

In a case where two rows of pad groups are arranged in parallel as shown in FIG. 4, it is necessary to connect the pad group 12-1 on the first row to the upper side leads 13 and connect the pad group 12-2 on the second row to the lower side leads 13. In such an arrangement, the connecting positions between the pads and the leads are restricted. On the other hand, by offsetting the pads of the pad group 12-1 from the corresponding pads of the pad group 12-2, it becomes possible to bond the leads on the pads disposed on the far side row as well as the pads disposed on the near side row as shown in FIG. 11. In such an arrangement, the degree of freedom of the pattern layout of the internal circuit and the pad layout can be enhanced. Further, the respective leads 13-1 and 13-2 can be connected to any one of three pads 12-1 and 12-2 adjacent thereto. Although the lead L1 of FIG. 11 is shown as connected to the pad P3 by the wire bonding, lead L1 could alternatively be easily connected to either pad P1 or pad P2 and the degree of freedom of wire bonding can be further enhanced.

Figure 12:
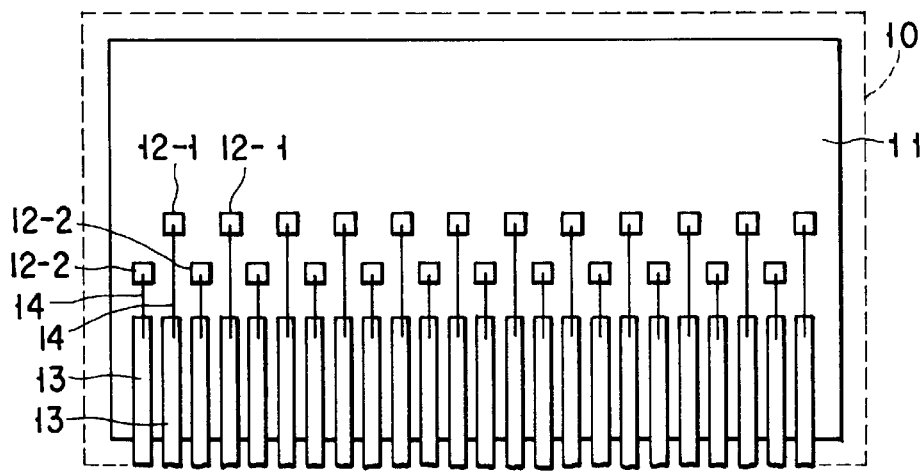
FIG. 12 is a plan view showing another example in which connections are made for a semiconductor memory device having the pad layout shown in FIG. 9 by wire bonding.

FIG. 12 shows another example of a state in which connection is made for a semiconductor memory device having the pad layout shown in FIG. 9 by wire bonding. As shown in FIG. 12, by disposing the pads of the first row so as to be offset or shifted from the corresponding pads of the second row, the pads can be arranged so as not to overlap each other when viewing the pads 12-1 and 12-2 from one side of the chip 11. That is, the distance Lt or Lr can be obtained between the pads when viewing the pads from the upper side or lower side. Therefore, in the structure having pads disposed on plural rows, the leads disposed on one side can be connected to the pads 12-1 and 12-2 by wire bonding.

Particularly, in recent memory products, since it is required to provide a large memory cell array area due to an increase in the memory capacity, the pad area is limited and the center pad whose layout has a high degree of matching with that of the memory cell array is dominant. If the center pad arranged on plural rows is used in the prior art, it becomes necessary to lead out the leads from both sides of the chip and the memory device cannot be applied to packages such as SVP and ZIP in which the leads are lead out from one side of the chip. However, according to this invention, the memory device can be sealed into the SVP or ZIP even if the pad layout of two rows is used.

Further, the above structure is effective not only for wire bonding but also for applying probes to the chip in the wafer state, whereby a plurality of chips can be simultaneously tested. In addition, when it becomes necessary to measure the signal amplitude or observe the signal waveforms on the signal lines at the time of development of products, the measurements and observations can be easily attained by applying a probe to the opposite side of the chip.

Figure 13:
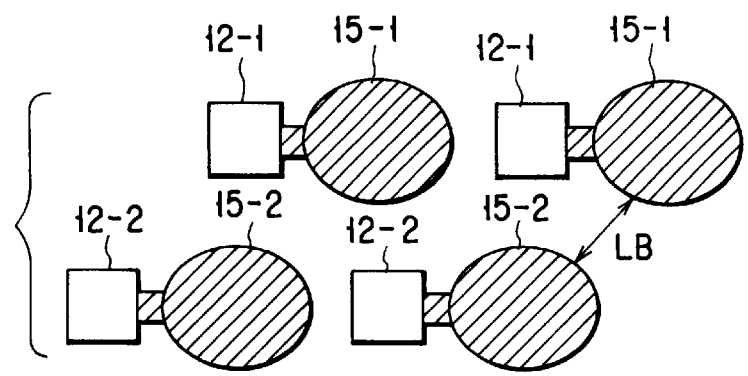
FIG. 13 is a plan view showing an example of the pattern layout of protection circuits, for illustrating a semiconductor device according to a second embodiment of this invention.

FIG. 13 shows an enlarged portion containing the pads 12-1, 12-2 in the semiconductor memory device shown in FIG. 9 and shows an example of the pattern layout of a protection circuit (such as an input protection circuit, output protection circuit, or input/output protection circuit). Protection circuits 15-1, 15-2 are disposed in spaces between the pads 12-1 and spaces between the pads 12-2 in the chip 11. The protection circuits 15-1, 15-2 are provided to protect the internal circuit from surge voltages and the like and are formed in deep diffusion layers such as well regions. In the layout of FIG. 6, the shortest distance between the protection circuits 15-1 and 15-2 is the vertical distance LA. However, in the layout of the pads and protection circuits shown in FIG. 13, the shortest distance between the protection circuits 15-1 and 15-2 is the distance LB in a diagonal direction. Therefore, the distance between the protection circuits 15-1 and 15-2 can be made sufficiently large without enlarging the pad area. As a result, the punch-through withstand voltage between the protection circuits 15-1 and 15-2 at the time of application of a surge voltage can be made sufficiently high.

Figure 14:
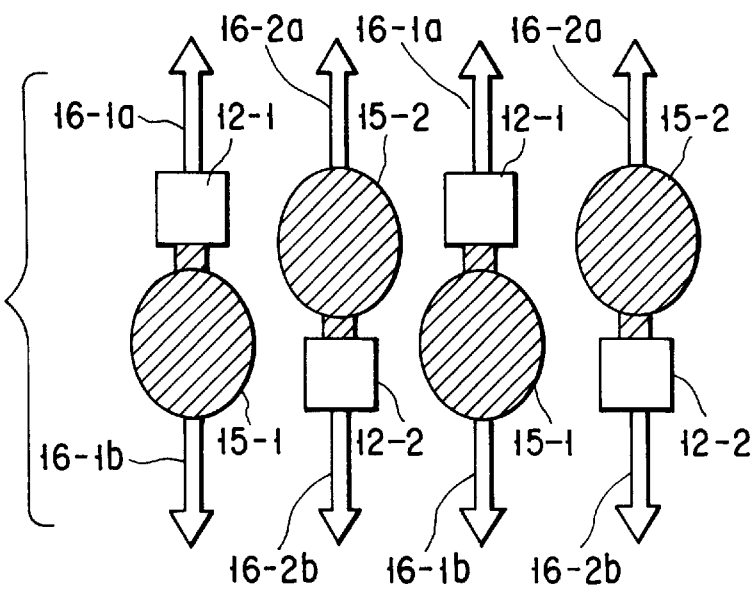
FIG. 14 is a plan view showing an example of the pattern layout of the protection circuits and an example of the lead-out of wirings from the protection circuits to the internal circuit, for illustrating a semiconductor device according to a third embodiment of this invention.

FIG. 14 shows an example of the lead-out of wirings from the protection circuit to the internal circuit in the semiconductor memory device shown in FIG. 9. The protection circuits 15-2 connected to the pads 12-2 in the second row are disposed in areas between the pads 12-1 in the first row and the protection circuits 15-1 connected to the pads 12-1 in the first row are disposed in areas between the pads 12-2 in the second row. Wirings 16-1a or 16-1b and wirings 16-2a or 16-2b extending in one of the upward direction and downward direction (in a direction perpendicular to the pad row) from the protection circuits 15-1, 15-2 to the internal circuit are selectively formed. In the example of the lead-out of the wirings and the protection circuit shown in FIG. 7, the wirings 16-1, 16-2 can be lead out only from one side indicated by the arrows, but as shown in FIG. 14, if the two rows of pad groups 12-1, 12-2 are offset by ½ pitch and the protection circuits 15-1, 15-2 are arranged in spaces in the pad groups 12-1, 12-2, then the wirings 16-1a or 16-1b and 16-2a or 16-2b can be freely lead out in the vertical direction. Therefore, it becomes unnecessary to lead the wirings 16-1, 16-2 to the opposite side via the space surrounding the pad rows or to enlarge the pitch between the pads so as to pass the wirings between them. As a result, the restriction on a reduction in the pitch of the pads can be alleviated, a reduction in wiring length and wiring resistance can be attained, and the restriction on the pattern layout of the internal circuit can be alleviated.

Figure 15:
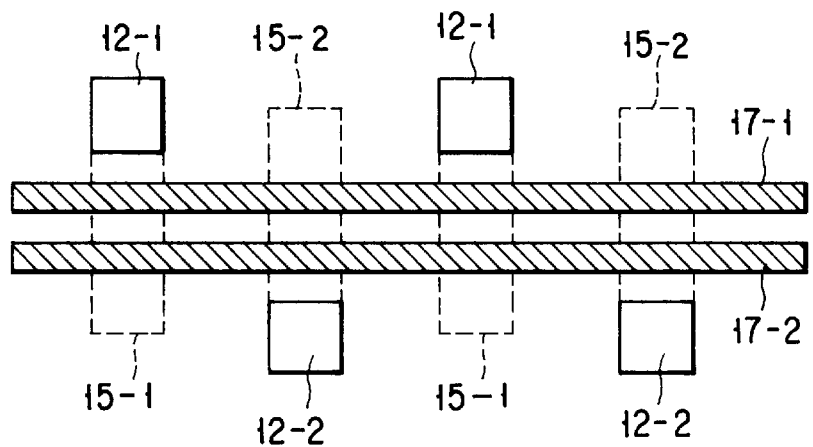
FIG. 15 is a plan view showing an example of the pattern layout of the protection circuits and an example of the layout of the power supply lines of the protection circuits, for illustrating a semiconductor device according to a fourth embodiment of this invention.

FIG. 15 shows an example of the pattern layout of the protection circuit and the power supply lines in the semiconductor memory device shown in FIG. 9. Power supply lines 17-1, 17-2 are linearly arranged in the area between the pad groups 12-1 and 12-2. The power supply lines 17-1, 17-2 pass above the protection circuit groups 15-1, 15-2 to directly supply power supply voltages to the protection circuit groups 15-1, 15-2.

In the layout shown in FIG. 8, it is necessary to dispose the main power supply lines on both sides of the two rows of pads, divide power supply lines from the main power supply line in a branch form and connect them to the respective protection circuits. However, by offsetting or shifting the pads on one row with respect to the pads on another row, the degree of freedom of the arrangement and positioning of the protection circuits and wirings from the protection circuits to the internal circuit can be enhanced, and at the same time, the layout of the power supply lines 17-1, 17-2 connected to the protection circuits can be simplified. Thus, a reduction in the occupancy area of the pad area can be achieved.

FIG. 16 is a plan view showing other examples of the pattern layouts of the protection circuits and power supply lines in the semiconductor memory device shown in FIG. 9. Protection circuits 28-1 are disposed in areas between the pads 12-1, and protection circuits 28-2 are disposed in areas between the pads 12-2. The protection circuit groups 28-1, 28-2 are formed in one or plural well regions. Bus lines 29-1, 29-2 are formed to extend in the direction in which the pad groups 12-1, 12-2 extend, and the pad groups 12-1, 12-2 and the protection circuit groups 28-1, 28-2 are disposed between the bus lines 29-1, 29-2. A power supply line 30a applied with a power supply voltage Vcc1 and a power supply line 30b applied with a power supply voltage Vss1 are formed to linearly extend in an area between the bus lines 29-1 and the pad group 12-1/protection circuit group 28-1. A power supply line 31a applied with a power supply voltage Vcc2 and a power supply line 31b applied with a power supply voltage Vss2 are formed to extend in an area between the pad group 12-1/protection circuit group 28-1 and the pad group 12-2/protection circuit group 28-2. A power supply line 32a applied with a power supply voltage Vcc3 and a power supply line 32b applied with a power supply voltage Vss3 are formed to extend in an area between the bus lines 29-2 and the pad group 12-2/protection circuit group 28-2.

Protection elements in the protection circuits 28-1, 28-2 respectively include input terminals 33-1, 33-2, Vcc terminals 34-1, 34-2, and Vss terminals 35-1, 35-2. Resistors 36-1, 36-2 are respectively connected between the input terminals 33-1, 33-2 of the protection circuits 28-1, 28-2 and the pads 12-1, 12-2. The input terminals 33-1 of the protection circuits 28-1 are selectively connected to the bus lines 29-1, and the input terminals 33-2 of the protection circuits 28-2 are selectively connected to the bus lines 29-2. The Vcc terminals 34-1 of the protection circuits 28-1 are connected to the power supply lines 30a and 31a, and the Vcc terminals 34-2 of the protection circuits 28-2 are connected to the power supply lines 31a and 32a. Further, the Vss terminals 35-1 of the protection circuits 28-1 are connected to the power supply lines 30b and 31b, and the Vss terminals 35-2 of the protection circuits 28-2 are connected to the power supply lines 31b and 32b.

FIGS. 17A and 17B are circuit diagrams of the protection circuits 28-1, 28-2 shown in FIG. 16. The protection circuit shown in FIG. 17A includes a resistor R1 (corresponding to the resistor 36-1 or 36-2 in FIG. 16) and diodes D1, D2. One end of the resistor R1 is connected to the pad 12 and the other end of the resistor R1 is connected to the anode of the diode D1, the cathode of the diode D2 and the bus line 29 (29-1 or 29-2). The cathode of the diode D1 is connected to the power supply Vcc and the anode of the diode D2 is connected to the power supply Vss. When a positive high voltage is applied to the pad 12, the diode D2 is set into the breakdown condition to lower the cathode voltage of the diode D2 to the power supply voltage Vss, thus protecting the internal circuit. On the other hand, if a negative high voltage is applied to the pad 12, the diode D1 is set into the breakdown condition to cause a current flow from the power supply Vcc to the pad 12 via the resistor R1, thus protecting the internal circuit.

The protection circuit shown in FIG. 17B includes a resistor R1 and bipolar transistors T1, T2. One end of the resistor R1 is connected to the pad 12 and the other end of the resistor R1 is connected to the collector of the bipolar transistor T1, the emitter of the bipolar transistor T2 and the bus line 29. The emitter of the bipolar transistor T1 is connected to the power supply Vcc and the collector of the bipolar transistor T2 is connected to the power supply Vss. When a positive high voltage is applied to the pad 12, the emitter-base path of the bipolar transistor T2 is set into the breakdown condition to lower the emitter voltage of the bipolar transistor T2 to the power supply voltage Vss, thus protecting the internal circuit. On the other hand, if a negative high voltage is applied to the pad 12, the emitter-base path of the bipolar transistor T1 is set into the breakdown condition to cause a current flow from the power supply Vcc to the pad 12 via the resistor R1, thus protecting the internal circuit.

With the above construction, since the power supply lines 30a and 31a, the power supply lines 30b and 31b, the power supply lines 31a and 32a, and the power supply lines 31b and 32b can be connected to each other by utilizing the power supply wiring patterns of the protection circuit groups 28-1, 28-2 and connection of the power supply wirings can be made with high density, the operation of the circuit can be made stable and the power supply noise in the chip can be reduced. The resistances of the power supply wirings in the chip can be lowered by use of the power supply lines 30a, 30b, 31a, 31b, 32a, 32b arranged in a direction parallel to the pad groups 12-1, 12-2 and the power supply wirings can be effectively strengthened.

FIG. 18 shows still other examples of the pattern layouts of the protection circuits and power supply lines usable in the semiconductor memory device shown in FIG. 9. The pattern layout of FIG. 18 is different from the pattern layout of FIG. 16 in that the resistors 36-1, 36-2 are not provided, the pad groups 12-1, 12-2 are connected to the protection circuit groups 28-1, 28-2 via metal wirings 37-1, 37-2, and the pad groups 12-1, 12-2 are connected to the bus lines 29-1, 29-2 via metal wirings 38-1, 38-2. That is, the protection circuits 28-1 are provided in areas between the pads 12-1 and the protection circuits 28-2 are provided in areas between the pads 12-2. The bus lines 29-1, 29-2 are formed to extend with the pads 12-1, 12-2 and the protection circuits 28-1, 28-2 disposed therebetween. The power supply lines 30a and 30b are formed to extend in an area between the bus lines 29-1 and the pad group 12-1/protection circuit group 28-1. The power supply lines 31a and 31b are formed to extend in an area between the pad group 12-1/protection circuit group 28-1 and the pad group 12-2/protection circuit group 28-2. The power supply lines 32a and 32b are formed to extend in an area between the bus lines 29-2 and the pad group 12-2/protection circuit group 28-2.

Protection elements in the protection circuits 28-1, 28-2 respectively include input terminals 33-1, 33-2, Vcc terminals 34-1, 34-2, and Vss terminals 35-1, 35-2. The input terminals 33-1, 33-2 of the protection circuits 28-1, 28-2 and the pads of pad groups 12-1, 12-2 are connected together via the metal wirings 37-1, 37-2. The input pads 12-1 are selectively connected to the bus lines 29-1 via the metal wirings 38-1, and the input pads 12-2 are selectively connected to the bus lines 29-2 via the metal wirings 38-2. The Vcc terminals 34-1 of the protection circuits 28-1 are connected to the power supply lines 30a and 31a, and the Vcc terminals 34-2 of the protection circuits 28-2 are connected to the power supply lines 31a and 32a. Further, the Vss terminals 35-1 of the protection circuits 28-1 are connected to the power supply lines 30b and 31b, and the Vss terminals 35-2 of the protection circuits 28-2 are connected to the power supply lines 31b and 32b.

FIGS. 19A and 19B are circuit diagrams of the protection circuits shown in FIG. 18. The protection circuit shown in FIG. 19A includes diodes D1, D2. The pad 12 is connected to the anode of the diode D1, the cathode of the diode D2 and the bus line 29 (29-1 or 29-2) via the metal wiring 38 (38-1 or 38-2). The cathode of the diode D1 is connected to the power supply Vcc and the anode of the diode D2 is connected to the power supply Vss. When a positive high voltage is applied to the pad 12, the diode D2 is set into the breakdown condition to lower the cathode voltage of the diode D2 to the power supply voltage Vss, thus protecting the internal circuit. On the other hand, if a negative high voltage is applied to the pad 12, the diode D1 is set into the breakdown condition to cause a current flow from the power supply Vcc to the pad 12, thus protecting the internal circuit.

The protection circuit shown in FIG. 19B includes bipolar transistors T1, T2. The pad 12 is connected to the collector of the bipolar transistor T1, the emitter of the bipolar transistor T2 and the bus line 29 via the metal wiring 38. The emitter of the bipolar transistor T1 is connected to the power supply Vcc and the collector of the bipolar transistor T2 is connected to the power supply Vss. When a positive high voltage is applied to the pad 12, the emitter-base path of the bipolar transistor T2 is set into the breakdown condition to lower the emitter voltage of the bipolar transistor T2 to the power supply voltage Vss, thus protecting the internal circuit. On the other hand, if a negative high voltage is applied to the pad 12, the emitter-base path of the bipolar transistor T1 is set into the breakdown condition to cause a current flow from the power supply Vcc to the pad 12, thus protecting the internal circuit.

With the above construction, basically the same effect and operation as those of the pattern shown in FIG. 16 and the circuits shown in FIGS. 17A and 17B can be attained. In the construction shown in FIGS. 16, 17A, 17B, since signals input to the pads 12-1, 12-2 are supplied to the internal circuit via the resistors 36-1, 36-2 (or resistor R1), the advantage that the protection effect is high can be obtained, but delay occurs in the input signals. On the other hand, in the pattern and circuit construction shown in FIGS. 18, 19A, 19B, since signals input to the pads 12-1, 12-2 are directly supplied to the internal circuit, the signal delay can be reduced, but the protection effect becomes lower than that obtained in the case of FIGS. 16, 17A, 17B. Therefore, it is effective to selectively use the patterns shown in FIGS. 16 and 18 or the circuits shown in FIGS. 17A, 17B and 19A, 19B as required.

In FIG. 18, the pads 12-1, 12-2 and the bus lines 29-1, 29-2 are connected together via the metal wirings 38-1, 38-2, but like the pattern shown in FIG. 16, it is possible to connect the pads 12-1, 12-2 to the bus lines 29-1, 29-2 via the protection circuits 28-1, 28-2. Further, it is possible to selectively provide a portion in which the pads are connected to the bus lines via the metal wirings and a portion in which the pads are connected to the bus lines via the protection circuits and provide the connecting portions on the same chip, if necessary. This construction is adequate when the pattern layout of the protection circuit shown in FIG. 14 is used.

Figure 20:
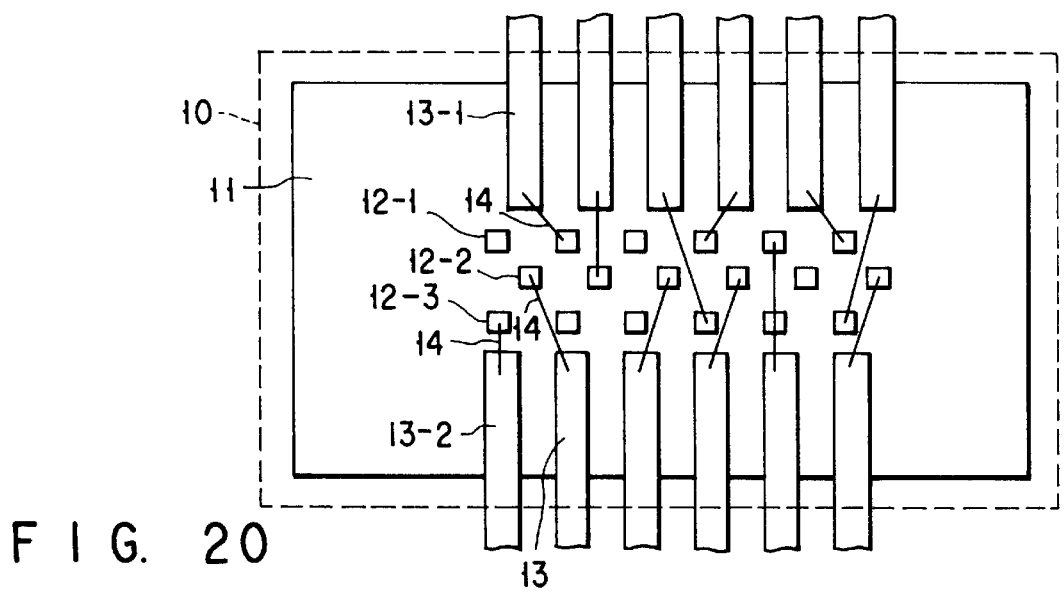
FIG. 20 is a plan view showing connections are made by wire bonding with LOC, for illustrating a semiconductor device according to a seventh embodiment of this invention.

FIG. 20 illustrates a semiconductor device according to a seventh embodiment of this invention in which connection is made by wire bonding with LOC. In this embodiment, three rows of pad groups 12-1, 12-2, 12-3 are provided. The pads of the pad group 12-1 in the first row are shifted from the pads of the pad group 12-2 in the second row by ½ pitch, and the pads in the pad group 12-2 in the second row are shifted from the pads of the pad group 12-3 in the third row by ½ pitch.

Figure 5:
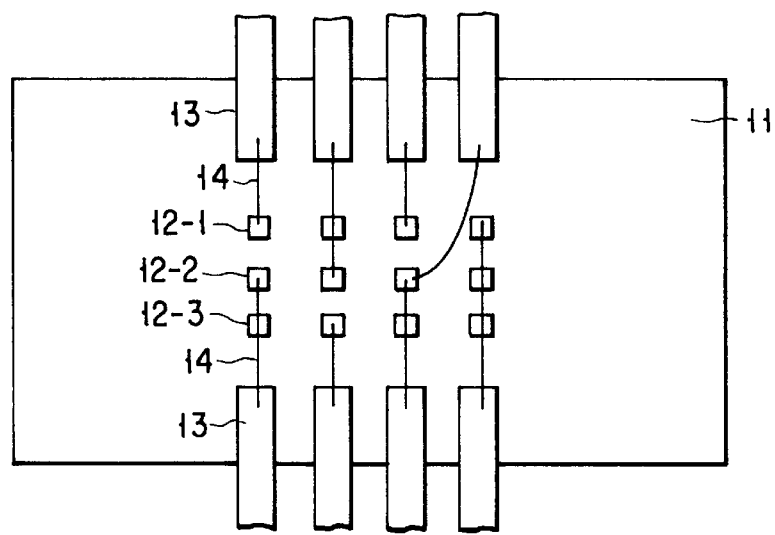
FIG. 5 is a plan view for illustrating another conventional improved semiconductor device in which connection is made by wire bonding with LOC.

The above construction is adequate when the chip size is small and it is required to reduce the length of each row in the lateral direction and it is possible to provide four or more rows, if necessary. As is clearly understood by comparison with the case of FIG. 5, the leads 13 and the pads 12-1 to 12-3 can be selectively connected together via the bonding wires 14 with a high degree of freedom and wire bonding can be simplified. In the pad layout of the seventh embodiment, bonding to the pads from one side is more difficult, but substantially the same effect and operation as in the first embodiment can be obtained in other respects. In FIG. 20, pads which are not connected to the leads 13 may be used as monitor pads for testing or pads which do not require wire bonding.

Figure 21:
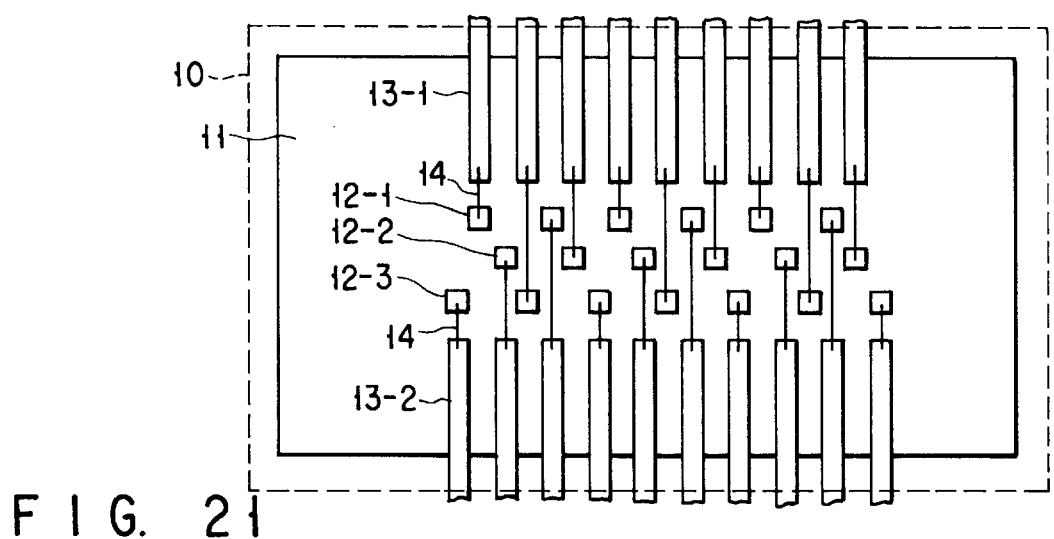
FIG. 21 is a plan view showing connections are made by wire bonding with LOC, for illustrating a semiconductor device according to a eighth embodiment of this invention.

FIG. 21 illustrates a semiconductor device according to an eighth embodiment of this invention and shows a state in which connection is made by wire bonding with LOC. Like the seventh embodiment, in the eighth embodiment, three rows of pad groups are provided, but pads of the pad group 12-1 in the first row are shifted from pads.of the pad group 12-2 in the second row by ⅓ pitch, and the pads of the pad group 12-2 in the second row are shifted from pads of the pad group 12-3 in the third row by ⅓ pitch.

Figure 22:
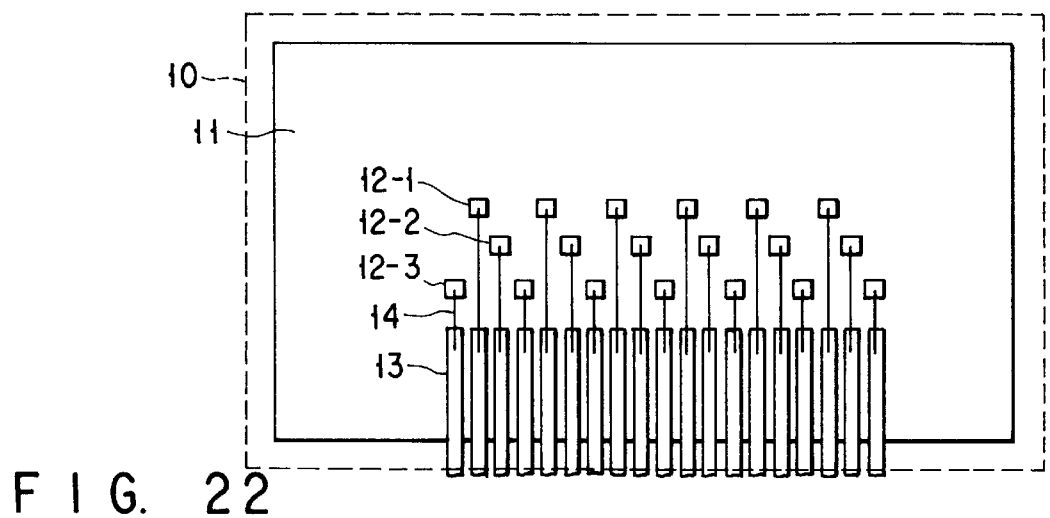
FIG. 22 is a plan view showing connections are made by wire bonding with LOC, for illustrating another lead layout in the layout shown in FIG. 21.

With the above construction, the same effect and operation as in the seventh embodiment can be attained. In the pad layout according to the eighth embodiment, since the pads of the pad groups 12-1 to 12-3 on the respective rows will not overlap when viewing them in a direction in which the leads extend, bonding to the pads from one side can be attained as shown in FIG. 22 even if the pads of three rows are provided. Therefore, the degree of freedom of wire bonding and the degree of freedom of packaging can be enhanced and a simultaneous test for plural chips and observation of the internal waveforms of the chip can be made at the time of probing to the chip in the wafer state.

Figure 23:
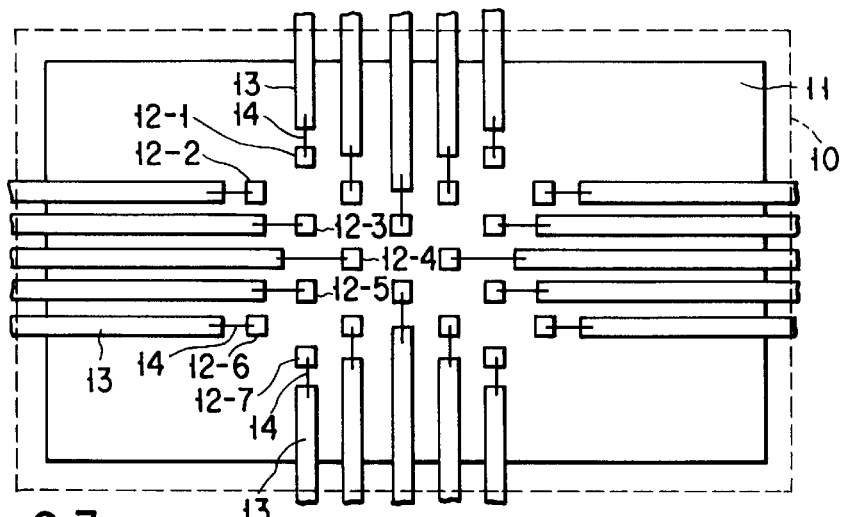
FIG. 23 is a plan view showing connections are made by wire bonding with LOC, for illustrating a semiconductor device according to a ninth embodiment of this invention.

FIG. 23 illustrates a semiconductor device according to a ninth embodiment of this invention in which connection is made by wire bonding with LOC. This construction is a pad layout used when leads are formed to extend from four sides of a semiconductor chip 11 and is adequately used for QFP (Quad Flat Package), QFJ (Quad Flat J-leaded Package), and QFI (Quad Flat I-leaded Package). Pads are arranged in seven rows. The number of pads of the pad groups 12-1 to 12-7 in the first to seventh rows are different and the pads are radially arranged from the central portion to the peripheral portion. As shown in FIG. 19, by arranging the pads in plural rows and setting the pads on each row in position shifted from the pads on the adjacent row, the wire bonding can be freely attained even when the leads are formed to extend from two or more sides. Further, by setting the front ends of the leads 13 gradually closer to a corresponding side of the chip according to the pad layout (by gradually increasing or reducing the distance between the side of the chip via which the leads 13 extend onto the chip 11 and the terminating position in a direction parallel to the side of the chip), the distances between the pads 12-1 to 12-7 and the corresponding leads 13 can be made short, the short-circuit between the bonding wires 14 and the interference between the bonding wire 14 and the lead 13 can be prevented.

Figure 24:
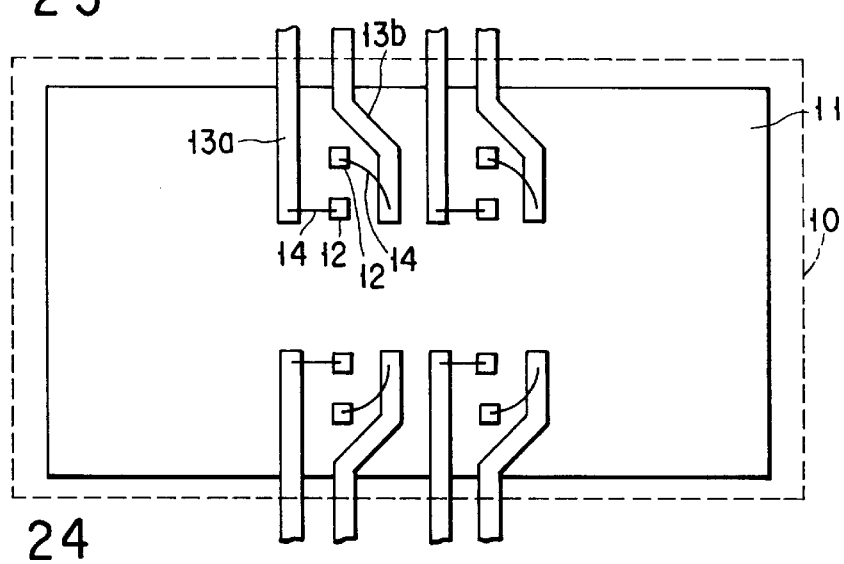
FIG. 24 is a plan view showing connections are made by wire bonding with LOC, for illustrating a semiconductor device according to a tenth embodiment of this invention.

FIG. 24 illustrates a semiconductor device according to a tenth embodiment of this invention in which connection is made by wire bonding with LOC. In the first and seventh to ninth embodiments described above, the pads in each row are set in position shifted from the pads in the other rows, but in the tenth embodiment, pads are arranged in two parallel columns and some of the leads are partly bent (the front ends thereof are set in shifted positions) in the row direction. That is, a pair of leads 13a and 13b are disposed in the column direction with the two pads 12 disposed therebetween and the leads 13a, 13b are connected to the respective pads 12 via bonding wires 14. The layouts of the pads 12 and the leads 13a, 13b are arranged symmetrically with respect to the column direction and row direction of the chip 11.

With the above construction, the effect obtained by shifting the pads 12 in the different rows as indicated in the first and seventh to ninth embodiments cannot be attained, but problems caused by dividing the pads into plural rows may be coped with by partly bending the leads 13b (shifting the front ends thereof) when the pad layout is restricted (the positions of the pads are fixed) by the internal circuit.

Figure 25:
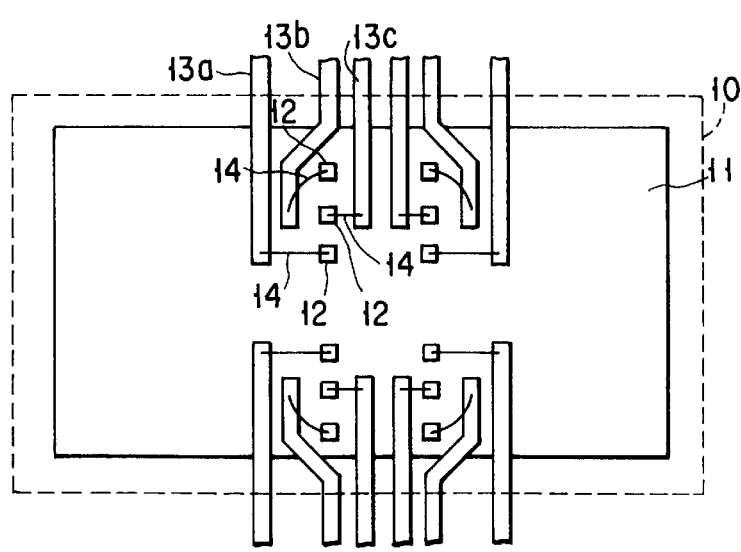
FIG. 25 is a plan view showing connections are made by wire bonding with LOC, for illustrating a semiconductor device according to an eleventh embodiment of this invention.

FIG. 25 illustrates a semiconductor device according to an eleventh embodiment of this invention in which connection is made by wire bonding with LOC. Like the tenth embodiment, in the eleventh embodiment, pads are arranged in two parallel columns and the front ends of some of the leads are set in positions shifted in the row direction. That is, three leads 13a to 13c are arranged to partly surround the three pads disposed in the column direction and the front end portions of the leads are connected to the respective pads by wire bonding. The layouts of the pads 12 and the leads 13a to 13c are arranged symmetrically with respect to the column direction and row direction of the chip 11.

With the above construction, the same effect as in the tenth embodiment can be attained. In the pad layout and lead layout shown in FIG. 24, it is possible to change the positions of the front ends of the leads in the same manner as in the ninth embodiment, if necessary.

This invention is not limited to the first to eleventh embodiments described above and can be variously modified without departing from the technical scope thereof. For example, the pads are not necessarily arranged in the central portion of the chip but can be arranged in a peripheral portion or portions (along one side, two sides, three sides or four sides). Even if the pad layout is partly cut apart or is formed in a single row form, the substantial operation and effect can be maintained. Further, the arrangement of the protection circuits and power supply lines shown in FIGS. 13 to 16, 17A, 17B, 18, 19A, 19B of the second to sixth embodiments can be basically applied to all of the seventh to eleventh embodiments although the leadout of the wirings will be partly restricted if the pad groups are formed in three or more rows, for example.

As described above, according to this invention, a semiconductor device having an improved pad layout and lead layout can be provided. Further, there is provided a semiconductor device having a pad layout and lead layout which can cope with reductions in chip size, increases in the number of pins of a package, and reductions in the pitch of the pads while solving problems occurring at the time of wire bonding, connection to the protection circuits, extension of the wirings, and testing. In addition, there is provided a semiconductor device having a pad layout which can cope with reductions in chip size, increases in the number of pins of a package, and reductions in the pitch of the pads even when the pad layout is restricted by the internal circuit.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

The invention claimed is:

1. A semiconductor device comprising:
   a semiconductor chip;
   a circuit formed in said semiconductor chip;
   a first pad group comprising pads of substantially the same size, where the pads are provided on said semiconductor chip, spaced apart from one another, arranged on a central portion of said semiconductor chip and electrically connected to said circuit;
   a second pad group comprising pads of substantially the same size as the pads in the first pad group and provided on said semiconductor chip, spaced apart from one another, arranged on a central portion of said semiconductor chip and electrically connected to said circuit, the pads of the second pad group being offset from the pads of the first pad group by one-half of a pitch of the pads of the first pad group in a direction where the pads are spaced apart from one another and an aligned line of the second pad group being spaced apart from an aligned line of the first pad group by a distance shorter than the pitch;
   a first lead group comprising leads, each lead of the first lead group having a lead portion having a center line substantially aligned with a center of a corresponding pad of the second pad group;
   a second lead group comprising leads, each lead of the second lead group having a lead portion having a center line substantial aligned with a center of a corresponding pad of the first pad group; and
   bonding wires electrically connecting the lead portions of the leads of the first and second lead groups to the pads of the first and second pad groups.

2. A semiconductor device according to claim 1, further comprising:
   first protection circuits formed in the spaces between the pads of said first pad group, and second protection circuits formed in the spaces between the pads of said second pad group.

3. A semiconductor device according to claim 2, further comprising:
   first wirings electrically connected to said circuit and extending from said first protection circuits in a direction perpendicular to the direction in which the pads of said first and second pad groups are spaced apart; and
   second wirings electrically connected to said circuit and extending from said second protection circuits in a direction perpendicular to the direction in which the pads of said first and second pad groups are spaced apart.

4. A semiconductor device according to claim 2, further comprising:
    power supply lines for supplying power supply voltages to said first and second protection circuits, said power supply lines arranged in an area between said first and second pad groups and extending in substantially the same direction as the direction in which the pads of said first and second pad groups are spaced apart.

5. A semiconductor device according to claim 2, further comprising:
    first and second bus line groups each including bus lines arranged to extend in substantially the same direction as the direction in which the pads of said first and second pad groups are spaced apart, wherein said first and second pad groups are disposed between said first and second bus line groups;
    first power supply lines arranged in an area between said first and second pad groups and extending in substantially the same direction as the direction in which said first and second pad groups are spaced apart;
    second power supply lines arranged in an area between said first bus line group and said first pad group and extending in substantially the same direction as the direction in which the pads of said first pad group are spaced apart; and
    third power supply lines arranged in an area between said second bus line group and said second pad group and extending in substantially the same direction as the direction in which the pads of said second pad group are spaced, wherein
    power supply voltages are supplied from said first and second power supply lines to said first protection circuits, signals input to said first pad group are selectively supplied to bus lines in said first bus line group via said first protection circuits, power supply voltages are supplied from said first and third power supply lines to said second protection circuits, and signals input to said second pad group are selectively supplied to bus lines in said second bus line group via said second protection circuits.

6. A semiconductor device according to claim 2, further comprising:
    first and second bus line groups each including bus lines arranged to extend in substantially the same direction as the direction in which the pads of said first and second pad groups are spaced apart, wherein said first and second pad groups are disposed between said first and second bus line groups;
    first power supply lines arranged in an area between said first and second pad groups and extending in substantially the same direction as the direction in which said first and second pad groups are spaced apart;
    second power supply lines arranged in an area between said first bus line group and said first pad group and extending in substantially the same direction as the direction in which the pads of said first pad group are spaced apart; and
    third power supply lines arranged in an area between said second bus line group and said second pad group and extending in substantially the same direction as the direction in which the pads of said second pad group are spaced apart, wherein
    power supply voltages are supplied from said first and second power supply lines to said first protection circuits, signals input to said first pad group are supplied to said first protection circuits and selectively supplied to bus lines in said first bus line group, power supply voltages are supplied from said first and third power supply lines to said second protection circuits, and signals input to said second pad group are supplied to said second protection circuits and selectively supplied to bus lines in said second bus line group.

7. A semiconductor device according to claim 1, wherein the pitch between adjacent ones of the pads of said first pad group is substantially constant, the pitch between adjacent ones of the pads of said second pad group is substantially constant, the pitch between adjacent ones of the leads of said first lead group is substantially constant, and the pitch between adjacent ones of the leads of said second lead group is substantially constant.

8. A semiconductor device according to claim 1, further comprising:
    a package for sealing said semiconductor chip, the lead portions of the leads of said first and second lead groups, and said bonding wires.

9. A semiconductor device comprising:
    a semiconductor chip;
    a circuit formed in said semiconductor chip;
    a first pad group comprising pads of substantially the same size, where the pads are provided on said semiconductor chip, spaced apart from one another, arranged on a central portion of said semiconductor chip and electrically connected to said circuit;
    a second pad group comprising pads of substantially the same size as the pads in the first pad group and provided on said semiconductor chip, spaced apart from one another, arranged on a central portion of said semiconductor chip and electrically connected to said circuit, the pads of the second pad group being offset from the pads of the first pad group by one-half of a pitch of the pads of the first pad group in a direction where the pads are spaced apart from one another and an aligned line of the second pad group being spaced apart from an aligned line of the first pad group by a distance shorter than the pitch;
    a lead group comprising leads, each lead of the lead group having a lead portion provided in correspondence with one of the pads of either the first or second groups, where the leads of the lead group each extend away from the first and second pad groups in substantially the same direction; and
    bonding wires electrically connecting the lead portions of the leads of the lead group to the pads of the first and second pad groups.

10. A semiconductor device according to claim 9, further comprising:
    first protection circuits formed in the spaces between the pads of said first pad group, and second protection circuits formed in the spaces between the pads of said second pad group.

11. A semiconductor device according to claim 10, further comprising;
    first wirings electrically connected to said circuit and extending from said first protection circuits in a direction perpendicular to the direction in which the pads of said first and second pad groups are spaced apart; and
    second wirings electrically connected to said circuit and extending from said second protection circuits in a direction perpendicular to the direction in which the pads of said first and second pad groups are spaced apart.

12. A semiconductor device according to claim 10, further comprising:
  power supply lines for supplying power supply voltages to said first and second protection circuits, said power supply lines arranged in an area between said first and second pad groups and extending in substantially the same direction as the direction in which the pads of said first and second pad groups are spaced apart.

13. A semiconductor device according to claim 10, further comprising:
  first and second bus line groups each including bus lines arranged to extend in substantially the same direction as the direction in which the pads of said first and second pad groups are spaced apart, wherein said first and second pad groups are disposed between said first and second bus line groups;
  first power supply lines arranged in an area between said first and second pad groups and extending in substantially the same direction as the direction in which said first and second pad groups are spaced apart;
  second power supply lines arranged in an area between said first bus line group and said first pad group and extending in substantially the same direction as the direction in which the pads of said first pad group are spaced apart; and
  third power supply lines arranged in an area between said second bus line group and said second pad group and extending in substantially the same direction as the direction in which the pads of said second pad group are spaced apart, wherein
  power supply voltages are supplied from said first and second power supply lines to said first protection circuits, signals input to said first pad group are selectively supplied to bus lines in said first bus line group via said first protection circuits, power supply voltages are supplied from said first and third power supply lines to said second protection circuits, and signals input to said second pad group are selectively supplied to bus lines in said second bus line group via said second protection circuits.

14. A semiconductor device according to claim 10, further comprising:
  first and second bus line groups each including bus lines arranged to extend in substantially the same direction as the direction in which the pads of said first and second pad groups are spaced apart, wherein said first and second pad groups are disposed between said first and second bus line groups;
  first power supply lines arranged in an area between said first and second pad groups and extending in substantially the same direction as the direction in which said first and second pad groups are spaced apart;
  second power supply lines arranged in an area between said first bus line group and said first pad group and extending in substantially the same direction as the direction in which the pads of said first pad group are spaced apart; and
  third power supply lines arranged in an area between said second bus line group and said second pad group and extending in substantially the same direction as the direction in which the pads of said second pad group are spaced apart, wherein
  power supply voltages are supplied from said first and second power supply lines to said first protection circuits, signals input to said first pad group are supplied to said first protection circuits and selectively supplied to bus lines in said first bus line group, power supply voltages are supplied from said first and third power supply lines to said second protection circuits, and signals input to said second pad group are supplied to said second protection circuits and selectively supplied to bus lines in said second bus line group.

15. A semiconductor device according to claim 9, wherein the pitch between adjacent ones of the pads of said first pad group is substantially constant, the pitch between adjacent ones of the pads of said second pad group is substantially constant, and leads of said lead group are arranged at a pitch equal to half the pitch of said first and second pad groups.

16. A semiconductor device according to claim 9, further comprising:
  a package for sealing said semiconductor chip, the lead portions of the leads of said lead group, and said bonding wires.

17. A semiconductor device comprising:
  a semiconductor chip;
  a circuit formed in said semiconductor chip;
  a first pad group comprising spaced apart pads arranged on said semiconductor chip and electrically connected to said circuit;
  a second pad group comprising spaced apart pads arranged on said semiconductor chip and electrically connected to said circuit, the pads of said second pad group being offset from the pads of said first pad group by one-third of the pitch of the pads of said first pad group;
  a third pad group comprising spaced apart pads arranged on said semiconductor chip and electrically connected to said circuit, the pads of said third pad group being offset from the pads of said second pad group by one-third of the pitch of the pads of said second pad group and being offset from the pads of said first pad group by two-thirds of the pitch of the pads of said first pad group;
  a first lead group, each lead of said first lead group having a lead portion which extends in a direction which is substantially perpendicular to the direction in which the pads of said first, second, and third pad groups are spaced apart, the lead portions of the leads of said first lead group disposed at a pitch which is equal to two-thirds of the pitch of the pads of said first and second pad groups;
  a second lead group, each lead of said second lead group having a lead portion extending toward the lead portions of the leads of said first lead group, the lead portions of the leads of said second lead group being disposed at a pitch which is equal to two-thirds of the pitch of the pads of said first and second pad groups and being arranged in positions offset from the respective lead portions of the leads of said first lead group by ⅓ pitch; and
  bonding wires for selectively connecting the lead portions of the leads of said first and second lead groups to the pads of said first, second and third pad groups.

18. A semiconductor device according to claim 17, further comprising:
  first protection circuits formed in the spaces between the pads of said first pad group;
  second protection circuits formed in the spaces between the pads of said second pad group; and
  third protection circuits formed in the spaces between the pads of said third pad group.

19. A semiconductor device according to claim 18, further comprising:
   power supply lines for supplying power supply voltages to said first, second, and third protection circuits, said power supply lines arranged in one of an area between said first and second pad groups and an area between said second and third pad groups and extending in substantially the same direction as the direction in which the pads of said first, second, and third pad groups are spaced apart.

20. A semiconductor device according to claim 17, wherein the pitch between adjacent ones of the pads of said first pad group is substantially constant, the pitch between adjacent ones of the pads of said second pad group is substantially constant, and the pitch between adjacent ones of the pads of said third pad group is substantially constant.

21. A semiconductor device according to claim 17, further comprising a package for sealing said semiconductor chip, the lead portions of the leads of said first and second lead groups, and said bonding wires.

22. A semiconductor device comprising:
   a semiconductor chip;
   a circuit formed in said semiconductor chip;
   a first pad group comprising spaced apart pads arranged on said semiconductor chip and electrically connected to said circuit;
   a second pad group comprising spaced apart pads electrically connected to said circuit, the pads of said second pad group being offset from the pads of said first pad group by one-third of the pitch of the pads of said first pad group;
   a third pad group comprising spaced apart pads electrically connected to said circuit, the pads of said third pad group being offset from the pads of said second pad group by one-third of the pitch of the pads of said second pad group and being offset from the pads of said first pad group by two-thirds of the pitch of the pads of said first pad group;
   a lead group, each lead having a lead portion which extends in a direction which is substantially perpendicular to the direction in which the pads of said first, second, and third pad groups are spaced apart; and
   bonding wires for selectively connecting the lead portions of the leads of said lead group to the pads of said first, second and third pad groups.

23. A semiconductor device according to claim 22, further comprising:
   first protection circuits formed in the spaces between the pads of said first pad group;
   second protection circuits formed in the spaces between the pads of said second pad group; and
   third protection circuits formed in the spaces between the pads of said third pad group.

24. A semiconductor device according to claim 23, further comprising:
   power supply lines for supplying power supply voltages to said first, second, and third protection circuits, said power supply lines arranged in one of an area between said first and second pad groups and an area between said second and third pad groups and extending in substantially the same direction as the direction in which the pads of said first, second, and third pad groups are spaced apart.

25. A semiconductor device according to claim 22, wherein the pitch between adjacent ones of the pads of said first pad group is substantially constant, the pitch between adjacent ones of the pads of said second pad group is substantially constant, the pitch between adjacent ones of the pads of said third pad group is substantially constant, and leads of said lead group are arranged at a pitch equal to $\frac{1}{3}$ of the pitch between the pads of said first to third pad groups.

26. A semiconductor device according to claim 22, further comprising a package for sealing said semiconductor chip, the lead portion of the leads of said lead group, and said bonding wires.

27. A semiconductor device comprising:
   a semiconductor chip;
   a circuit formed in said semiconductor chip;
   pads electrically connected to said circuit and arranged in a plurality of rows on a central portion of said semiconductor chip;
   leads provided on said semiconductor chip extending from at least one side thereof and connected to respective pads via bonding wires, at least two of said pads arranged in one of said rows being sandwiched between two adjacent leads, where said two adjacent leads are arranged in a row direction and extend out of said semiconductor chip from the same side of said semiconductor chip; and
   bonding wires electrically connecting said pads to leads.

28. A semiconductor device according to claim 27, further comprising protection circuits formed in the spaces between the pads.

29. A semiconductor device according to claim 27, wherein the distances from the chip end at which the leads extend onto said semiconductor chip to the terminal ends thereof are different in the chip.

30. A semiconductor device comprising:
   a circuit formed in said semiconductor chip;
   a first pad group comprising pads of substantially the same size, where the pads are provided on said semiconductor chip, spaced apart from one another, arranged on a central portion of said semiconductor chip and electrically connected to said circuit;
   a second pad group comprising pads of substantially the same size as the pads in the first pad group and provided on said semiconductor chip, spaced apart from one another, arranged on a central portion of said semiconductor chip and electrically connected to said circuit, the pads of the second pad group being offset from the pads of the first pad group by one-half of a pitch of the pads of the first pad group in a direction where the pads are spaced apart from one another and an aligned line of the second pad group being spaced apart from an aligned line of the first pad group by a distance shorter than the pitch;
   a first lead group comprising leads, each lead of the first lead group having a lead portion having a center line substantially aligned with a center of a corresponding pad of the second pad group;
   a second lead group comprising leads, each lead of the second lead group having a lead portion having a center line substantially aligned with a center of a corresponding pad of the first pad group; and
   bonding wires electrically connecting the lead portions of the leads of the first and second lead groups to the pads of the first and second pad groups, said bonding wires existing only above said semiconductor chip.

31. A semiconductor device according to claim 30, wherein the lead portion of each lead of the first and the second lead group is provided immediately above said semiconductor chip and said leads are substantially parallel with one another.

32. A semiconductor device comprising:

a semiconductor chip;

a circuit formed in said semiconductor chip;

a first pad group comprising pads of substantially the same size, where the pads are provided on said semiconductor chip, spaced apart from one another, arranged on a central portion of said semiconductor chip and electrically connected to said circuit;

a second pad group comprising pads of substantially the same size as the pads in the first pad group and provided on said semiconductor chip, spaced apart from one another, arranged on a central portion of said semiconductor chip and electrically connected to said circuit, the pads of the second pad group being offset from the pads of the first pad group by one-half of a pitch of the pads of the first pad group in a direction where the pads are spaced apart from one another and an aligned line of the second pad group being spaced apart from an aligned line of the first pad group by a distance shorter than the pitch;

a lead group comprising leads, each lead of the lead group having a lead portion provided in correspondence with one of the pads of either the first or second groups, where the leads of the lead group each extend away from the first and second pad groups in substantially the same direction; and bonding wires electrically connecting the lead portions of the leads of the lead groups to the pads of the first and second pad groups, said bonding wires existing only above said semiconductor chip.

33. A semiconductor device according to claim 32, wherein the lead portion of each lead of the lead group is provided immediately above said semiconductor chip and said leads are substantially parallel with one another.

34. A semiconductor device comprising:

a semiconductor chip;

a circuit formed in said semiconductor chip;

pads electrically connected to said circuit and arranged in a plurality of rows on a central portion of said semiconductor chip;

leads provided above said semiconductor chip and having lead portions, respectively, extending from at least one side of said semiconductor chip to the central portion thereof and connected to respective pads via bonding wires, at least two of said pads arranged in one of said rows being sandwiched between two adjacent leads by the lead portions, where said two adjacent leads are arranged in a row direction and extend out of said semiconductor chip from the same side of said semiconductor chip; and bonding wires electrically connecting said pads to leads, and existing only above said semiconductor chip.

35. The device of claim 1, wherein said leads of said first lead group extend onto said semiconductor chip.

36. The device of claim 9, wherein said leads of said lead group extend onto said semiconductor chip.

* * * * *

UNITED STATES PATENT AND TRADEMARK OFFICE
CERTIFICATE OF CORRECTION

PATENT NO. : 6,303,948 B1 Page 1 of 1
DATED : October 16, 2001
INVENTOR(S) : Manami Kudou et al.

It is certified that error appears in the above-identified patent and that said Letters Patent is hereby corrected as shown below:

Column 16,
Line 46, "substantial" has been replaced with -- substantially --.

Column 22,
After line 34, -- a semiconductor chip; -- has been inserted.

Signed and Sealed this

Nineteenth Day of November, 2002

Attest:

Attesting Officer

JAMES E. ROGAN
Director of the United States Patent and Trademark Office